United States Patent
Inoue et al.

(12) 
(10) Patent No.: US 6,509,593 B2
(45) Date of Patent: Jan. 21, 2003

(54) SEMICONDUCTOR DEVICE AND METHOD OF MANUFACTURING THE SAME

(75) Inventors: Kenichi Inoue, Kawasaki (JP); Yoshinori Obata, Kawasaki (JP); Takeyasu Saito, Kawasaki (JP); Kaoru Saigoh, Kawasaki (JP); Naoya Sashida, Kawasaki (JP); Koji Tani, Kawasaki (JP); Jirou Miura, Kawasaki (JP); Tatsuya Yokota, Kawasaki (JP); Satoru Mihara, Kawasaki (JP); Yukinobu Hikosaka, Kawasaki (JP); Yasutaka Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/750,069

(22) Filed: Dec. 29, 2000

(65) Prior Publication Data

US 2002/0011616 A1 Jan. 31, 2002

(30) Foreign Application Priority Data

Jun. 19, 2000 (JP) .......................... 2000-183210

(51) Int. Cl.$^7$ .......................... H01L 29/76; H01L 29/94; H01L 31/062; H01L 31/113
(52) U.S. Cl. ....................... 257/295; 257/296; 257/306; 257/758
(58) Field of Search .................. 257/68, 71, 295, 257/296, 306, 758, 760; 438/3, 240, 253, 256, 396, 399

(56) References Cited

U.S. PATENT DOCUMENTS 6,294,835 B1 * 9/2001 Dalal et al. ................. 257/760

FOREIGN PATENT DOCUMENTS

| JP | 9-51077 | 2/1997 |
|---|---|---|
| JP | 11-17124 | 1/1999 |
| JP | 11-238855 | 8/1999 |
| JP | 2000-36568 | 2/2000 |

* cited by examiner

Primary Examiner—Olik Chaudhuri
Assistant Examiner—Theresa T. Doan
(74) Attorney, Agent, or Firm—Armstrong, Westerman & Hattori, LLP

(57) ABSTRACT

A semiconductor device formed by forming contact holes in the insulating film, that covers the source/drain of the MOSFET and the capacitor in the memory cell region, on the lower electrode of the capacitor by the same steps, then filling the plugs into the contact holes, and then forming the contact hole on the upper electrode of the capacitor. Accordingly, there can be provided the semiconductor device having the ferroelectric capacitor, capable of simplifying respective wiring connection structures to the upper electrode and the lower electrode of the capacitor by suppressing the damage to the capacitor formed over the transistor.

4 Claims, 27 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and to a method of manufacturing the same and, more particularly, to a semiconductor device including a capacitor having a ferroelectric layer or a high- dielectric layer and to a method of manufacturing the same.

2. Description of the Related Art

The flash memory, the ferroelectric memory (FeRAM), etc. are known, as the nonvolatile memory that can still store the information after the power supply is turned off.

The flash memory has such a structure that the information are stored by accumulating charges in the floating gate that is buried in the gate insulating film of the insulated-gate field effect transistor (IGFET). The tunnel current that passes through the insulating film formed between the floating gate and the semiconductor substrate must be supplied to write or erase the information, and thus the high voltage is needed to write or erase the information.

The FeRAM has the ferroelectric capacitor and stores the information by using the hysteresis characteristic of the ferroelectric substance. The ferroelectric capacitor has a structure in which the ferroelectric film is put between a pair of electrodes. Such ferroelectric capacitor generates the polarization in response to the applied voltage between the electrodes and has the spontaneous polarization after the applied voltage is removed. If the polarity of the applied voltage is inverted, the polarity of the spontaneous polarization is also inverted. The information can be read by detecting the spontaneous polarization.

Accordingly, the FeRAM can be driven by the low voltage rather than the flash memory and thus can execute the high-speed writing by the saved power.

The FeRAM includes the MOSFET and the ferroelectric capacitor in the memory cell region. The ferroelectric capacitor is formed on the first insulating film, that covers the MOSFET formed on the semiconductor substrate, and is covered with the second insulating film. Various structures for connecting the ferroelectric capacitor and the MOSFET have been proposed.

For example, in Patent Application Publication (KOKAI) Hei 11-238855, the FeRAM manufacturing method is set forth which includes the steps of forming the first and second contact holes, that expose the upper electrode and the lower electrode of the capacitor, respectively, on the second insulating film covering the capacitor, then filling the conductive pattern in the first and second contact holes, then forming the third contact hole, that exposes the impurity diffusion layer, in the first insulating film covering the MOSFET, then filling the plug into the third contact hole, and then connecting the conductive pattern in the first contact hole and the plug in the third contact hole by the wiring.

In order to connect electrically the impurity diffusion layer of the MOSFET and the upper electrode of the capacitor, such FeRAM has the plug on the impurity diffusion layer of the MOSFET, the conductive pattern on the capacitor, and the wiring for connecting them. Thus, the structure becomes complicated and thus a number of manufacturing steps are requested.

In the FeRAM, in order to reduce the damage of the ferroelectric capacitor, it is preferable that the number of steps necessary for the connection between the ferroelectric capacitor and the MOSFET should be reduced.

On the contrary, in FIG. 3 of Patent Application Publication (KOKAI) 2000-36568, the FeRAM is set forth which has the structure including the first insulating film for covering the MOSFET, the ferroelectric capacitor formed on the first insulating film, and the second insulating film for covering the ferroelectric capacitor, whereby the impurity diffusion layer of the MOSFET and the upper electrode of the ferroelectric capacitor are connected by one plug formed the first and second insulating films and the wiring formed on the second insulating film.

According to this, throughput can be improved by simplifying the connecting structure between the MOSFET and the capacitor.

In the meanwhile, in the FeRAM set forth in Patent Application Publication (KOKAI) 2000-36568, the wiring structure for leading the lower electrode of the capacitor is not set forth. But it is preferable that the wiring structure connected to the lower electrode should be much more simplified.

As set forth in Patent Application Publication (KOKAI) Hei 11-238855, there may be considered the wiring connection to the lower electrode of the capacitor such that the holes are formed simultaneously on the lower electrode and the upper electrode of the capacitor and then the wiring is connected to the lower electrode via these holes.

However, in the case that the surface of the insulating film covering the capacitor is flat, depths of the hole formed on the lower electrode and the hole formed on the upper electrode become different. Therefore, if it is attempted to form simultaneously these holes, there is such a possibility that, because the hole formed on the upper electrode is formed early, the underlying ferroelectric film is damaged.

SUMMARY OF THE INVENTION

It is an object of the present invention to provide a semiconductor device capable of simplifying respective wiring connection structures to an upper electrode and a lower electrode of a capacitor by suppressing the damage to the capacitor formed over a transistor, and a method of manufacturing the same.

According to the above invention, the contact holes on the upper electrode of the capacitor and the contact holes on the lower electrode are not simultaneously opened, but the hole on the lower electrode is formed simultaneously with the holes on the impurity diffusion layers and then plugs are buried in the holes and then the hole is solely formed on the upper electrode of the capacitor. Therefore, the degradation of the dielectric film caused when the hole is formed on the upper electrode can be suppressed and the capacitor characteristics can be held satisfactorily.

In addition, since all holes can be formed in the second insulating film covering the capacitor by two steps, the increase in steps can be prevented.

Furthermore, since the first layer wiring formed on the second insulating film is directly connected without filling the plugs in the holes on the upper electrode of the capacitor, the capacitor can be prevented from the reducing gas used in forming the plugs.

Besides, since the first layer wiring extended from the hole on the upper electrode is connected to extend to the plugs on the impurity regions of the transistor, the complication of the structure can be prevented.

In the present invention, the holes are formed on the impurity diffusion layers on the semiconductor substrate and the lower electrode of the capacitor respectively out of the second insulating film that covers the transistor and the capacitor, then the metal plugs are buried into these holes, then the third hole is formed on the upper electrode of the capacitor while covering the plugs and the second insulating film with the oxidation preventing film such as the silicon oxide nitride, and the film quality of the capacitor is improved by the oxygen annealing. In addition, the dehydration process of the second insulating film is performed before the oxidation preventing film is formed, and then the second insulating film is annealed by the inert gas plasma. For example, the nitrogen gas is used as the inert gas.

Accordingly, it can be experimentally checked that, in the oxygen annealing, the oxidation of the plugs can be prevented and also the film peeling-off of the capacitor is difficult to occur.

The oxidation preventing film is removed by the etching after the oxygen annealing. At this time, since the second insulating film is etched slightly, the plugs are protruded slightly from the surface of the second insulating film.

DESCRIPTION OF THE PREFERRED EMBODIMENT

An embodiment of the present invention will be explained in detail with reference to the accompanying drawings hereinafter.

FIG. 1 to FIG. 21 are sectional views showing a semiconductor device manufacturing method in order of steps according to an embodiment of the present invention.

First, steps required to get the sectional structure shown in FIG. 1 will be explained hereunder.

Figure 1:
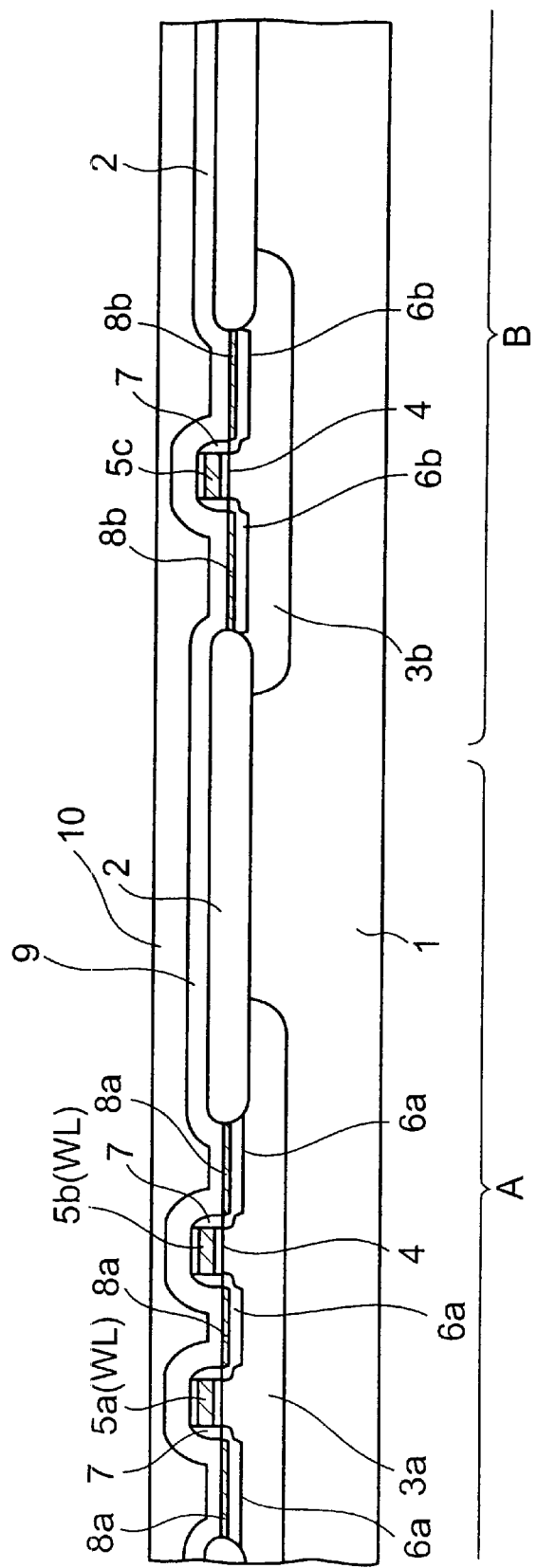
FIG. 1 to FIG. 21 are sectional views showing steps of manufacturing a FeRAM as a semiconductor device according to an embodiment of the present invention.

As shown in FIG. 1, a device isolation insulating film 2 is formed on a surface of an n-type or p-type silicon (semiconductor) substrate 1 by the LOCOS (Local Oxidation of Silicon) method. The STI (Shallow Trench Isolation) method, etc. in addition to the LOCOS method may be employed to form the device isolation insulating film 2.

After such device isolation insulating film 2 is formed, a p-well 3a and an n-well 3b are formed by introducing selectively the p-type impurity and the n-type impurity into predetermined active regions (transistor forming regions) in a memory cell region A and a peripheral circuit region B on the silicon substrate 1 respectively. Although not shown in FIG. 1, a p-well (not shown) is also formed in the peripheral circuit region B to form the CMOS.

Then, a silicon oxide film is formed as a gate insulating film 4 by thermally heating surfaces of the active regions on the silicon substrate 1.

Then, an amorphous silicon film or a polysilicon film is formed on an entire upper surface of the silicon substrate 1, and then the resistance of the silicon films are lowered by ion-implanting the n-type impurity and the p-type impurity into the silicon films on the p-well 3a and the n-well 3b respectively. Then, gate electrodes 5a to 5c are formed by patterning the silicon film into the predetermined shapes by virtue of the photolithography method.

Two gate electrodes 5a, 5b are arranged in substantially parallel on one p-well 3a in the memory cell region A. These gate electrodes 5a, 5b constitute a part of the word line WL.

Then, n-type impurity diffusion regions 6a serving as the source/drain of the n-channel MOS transistor are formed in the memory cell region A by ion-implanting the n-type impurity into the p-well 3a on both sides of the gate electrodes 5a, 5b. At the same time, n-type impurity diffusion regions are formed in the p-well (not shown) in the peripheral circuit region B. Then, p-type impurity diffusion regions 6b serving as the source/drain of the p-channel MOS transistor are formed in the peripheral circuit region B by ion-implanting the p-type impurity into the n-well 3b on both sides of the gate electrode 5c.

Then, an insulating film is formed on an overall surface of the silicon substrate 1, and then the insulating film is left as a sidewall insulating film 7 only on both side portions of the gate electrodes 5a to 5c by etching back the insulating film. A silicon oxide ($SiO_2$) is formed as the insulating film by the CVD method, for example.

Then, while using the gate electrodes 5a to 5c and the sidewall insulating films 7 as a mask, the n-type impurity diffusion regions 6a are formed into an LDD structure respectively by implanting the n-type impurity ion into the p-well 3a once again and also the p-type impurity diffusion regions 6b are formed into the LDD structure respectively by implanting the p-type impurity ion into the n-well 3b once again.

In this case, the ion-implantation of the n-type impurity and the p-type impurity is executed individually by using the resist pattern.

As described above, an n-type MOSFET is constructed in the memory cell region A by the p-well 3a, the gate electrodes 5a, 5b, the n-type impurity diffusion regions 6a formed on both sides of the gate electrodes 5a, 5b, etc. Also, a p-type MOSFET is constructed is constructed in the peripheral circuit region B by the n-well 3b, the gate electrode 5c, the p-type impurity diffusion regions 6b formed on both sides of the gate electrode 5c, etc.

Then, a refractory metal film, e.g., a Ti or Co film, is formed, and then refractory metal silicide layers 8a, 8b are formed on surfaces of the n-type impurity diffusion regions 6a and the p-type impurity diffusion regions 6b respectively by heating the refractory metal film. Then, the unreacted refractory metal film is removed by the wet etching.

Then, a silicon oxide nitride (SiON) film of about 200 nm is formed as a cover film 9 on an overall surface of the silicon substrate 1 by the plasma CVD method. Then, a silicon dioxide ($SiO_2$) of about 1.0 $\mu$m thickness is grown as a first interlayer insulating film 10 on the cover film 9 by the plasma CVD method using the TEOS gas.

Then, a surface of the first interlayer insulating film 1 is planarized by polishing it by means of the chemical mechanical polishing (CMP) method.

Figure 2:
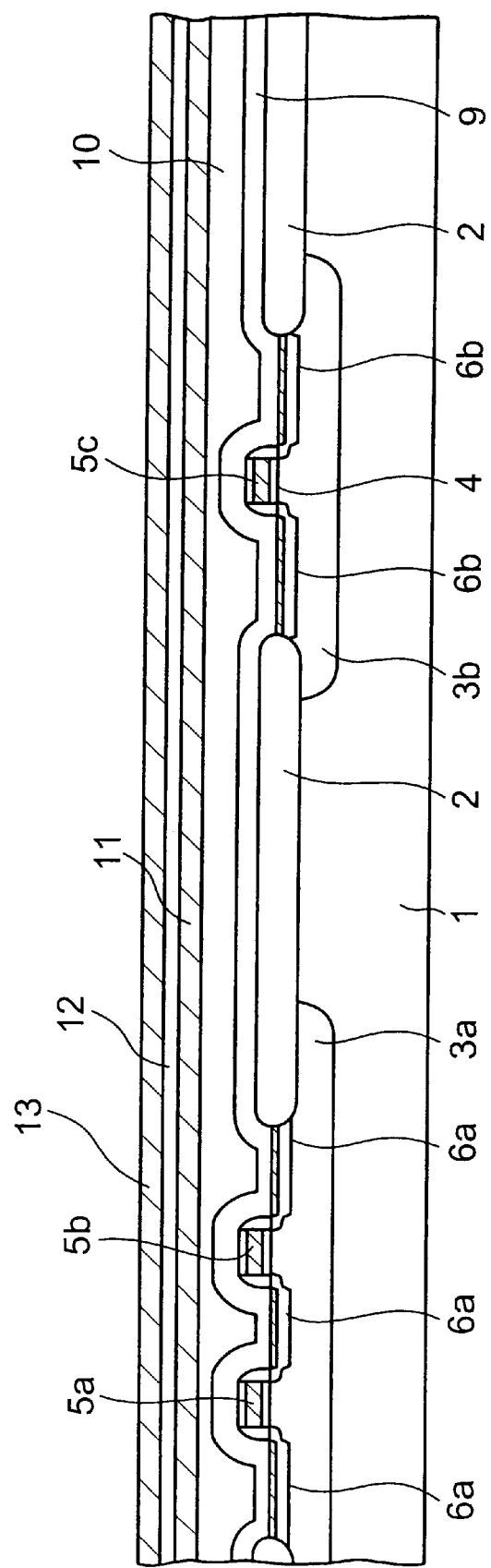

Next, steps required to get the structure shown in FIG. 2 will be explained hereunder.

First, a titanium (Ti) film and a platinum (Pt) film are formed in sequence as a first conductive film 11 by the DC sputter method. In this case, a thickness of the Ti film is set to about 10 to 30 nm, e.g., 20 nm, and a thickness of the Pt film is set to about 100 to 300 nm, e.g., 175 nm. This titanium film can perform a role to improve the adhesiveness between the platinum film and the first interlayer insulating film 10.

A film made of iridium, ruthenium, ruthenium oxide, strontium ruthenium oxide ($SrRuO_3$), etc. may be formed as the first conductive film 11.

Then, PLZT (lead lanthanum zirconate titanate; $(Pb_{1-3x/2}La_x)(Zr_{1-y}Ti_y)O_3$) to which calcium (Ca) and strontium (Sr) are added is formed on the first conductive film 11 by the sputtering method to have a thickness of 100 to 300 nm, e.g., 240 nm. This PLZT is used as a ferroelectric film 12. In some cases, calcium (Ca) and strontium (Sr) are not added to the PLZT film.

Then, the silicon substrate 1 is placed in the oxygen atmosphere. Then, the crystallizing process of the PLZT film is carried out by RTA (Rapid Thermal Annealing)—processing the PLZT film constituting the ferroelectric film 12 at the temperature of 725° C. and the temperature increasing speed 125° C./sec for 20 seconds, for example.

As the ferroelectric film forming method, there are the spin-on method, the sol-gel process, the MOD (Metal Organic Deposition) method, and the MOCVD method in addition to the above sputter method. Further, as the material of the ferroelectric film 12, there are PZT ($Pb(Zr_{1-x}Ti_x)O_3$), $SrBi_2(Ta_xNb_{1-x})_2O_9$ (where $0<x \leqq 1$), $Bi_4Ti_2O_{12}$, etc. in addition to PLZT. If the DRAM is formed, the high-dielectric material such as $(BaSr)TiO_3$ (BST), strontium titanate (STO), etc. may be employed in lieu of the above the ferroelectric material.

After such ferroelectric film 12 is formed, an iridium oxide ($IrO_x$) film of 100 to 300 nm thickness, e.g., 200 nm thickness, is formed thereon as a second conductive film 13 by the sputtering method. In this case, the platinum film or the strontium ruthenium oxide (SRO) film may be formed as the second conductive film 13 by the sputter method.

Figure 3:
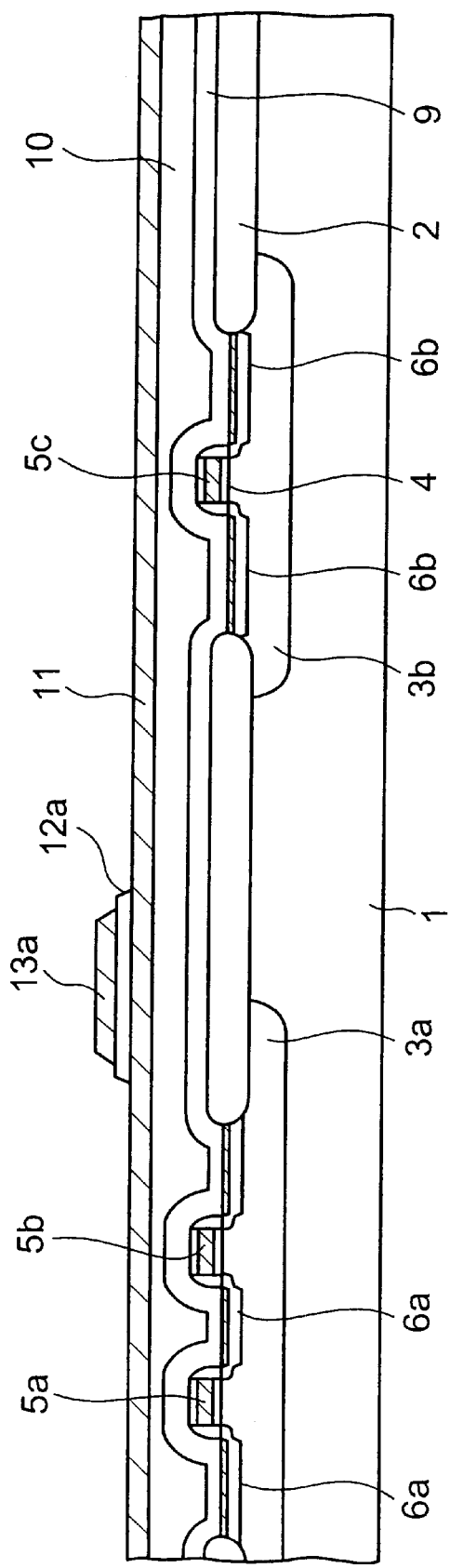

Next, steps required to get the structure shown in FIG. 3 will be explained hereunder.

First, a resist pattern (not shown) having an upper electrode profile is formed on the second conductive film 13. Then, the second conductive film 13 is etched while using the resist pattern as a mask, and thus the remaining second conductive film 13 is used as an upper electrode 13a of the capacitor.

Then, the resist pattern is removed, and then the ferroelectric film 12 is annealed at the temperature of 650° C. for 60 minutes in the oxygen atmosphere. This annealing is carried out to recover the damage of the ferroelectric film 12 caused in the sputtering and the etching.

Then, the ferroelectric film 12 is etched in the memory cell region A in the situation that a resist pattern (not shown) is formed on the upper electrode 13a and its peripheral area of the capacitor, and thus the remaining ferroelectric film 12 is used as a dielectric film 12a of the capacitor. Then, the resist pattern is removed, and then the ferroelectric film 12 is annealed at the temperature of 650° C. for 60 minutes in the oxygen atmosphere. This annealing is carried out to degas the moisture absorbed in the underlying film, etc.

Figure 4:
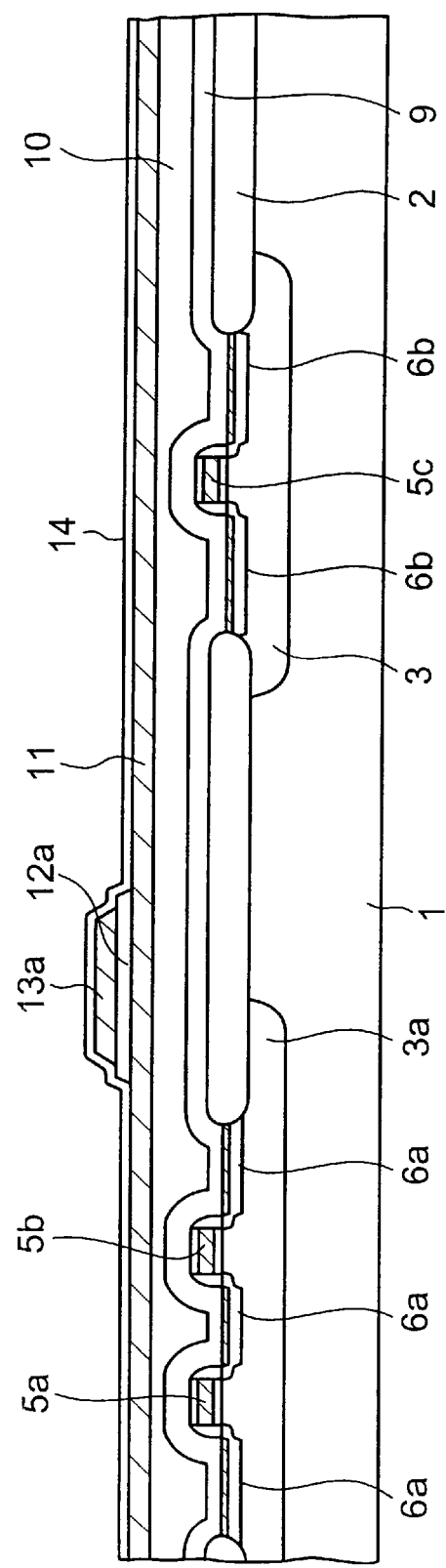

Then, as shown in FIG. 4, an $Al_2O_3$ film of 50 nm thickness is formed as an encapsulation layer 14 on the upper electrode 13a, the dielectric film 12a, and the first conductive film 11 by the sputtering method at the normal temperature. This encapsulation layer 14 is formed to protect the dielectric film 12a, that is ready to be reduced, from hydrogen by blocking the entering of the hydrogen into the inside of the dielectric film 12a. In this case, the PZT film, the PLZT film, or the titanium oxide film may be formed as the encapsulation layer 14.

After this, the film quality of the PLZT film 12 is improved by the RTA-processing the PLZT film 12 formed under the encapsulation layer 14 at 700° C. and the temperature increasing speed 125° C./sec for 60 seconds in the oxygen atmosphere.

Then, resist is coated on the encapsulation layer 14 and then the resist is left on the upper electrode 13a, the dielectric film 12a, and their peripheral areas by exposing/developing it. Then, the encapsulation layer 14 and the first conductive film 11 are etched by using the resist as a mask, and thus the remaining first conductive film 11 is used as a lower electrode 11a of the capacitor. The etching of the encapsulation layer 14 and the first conductive film 11 is performed by the dry etching using the chlorine.

Then, the resist pattern is removed, and then the ferroelectric film 12 is restored from the damage by annealing at 650° C. for 60 minutes in the oxygen atmosphere.

Figure 5:
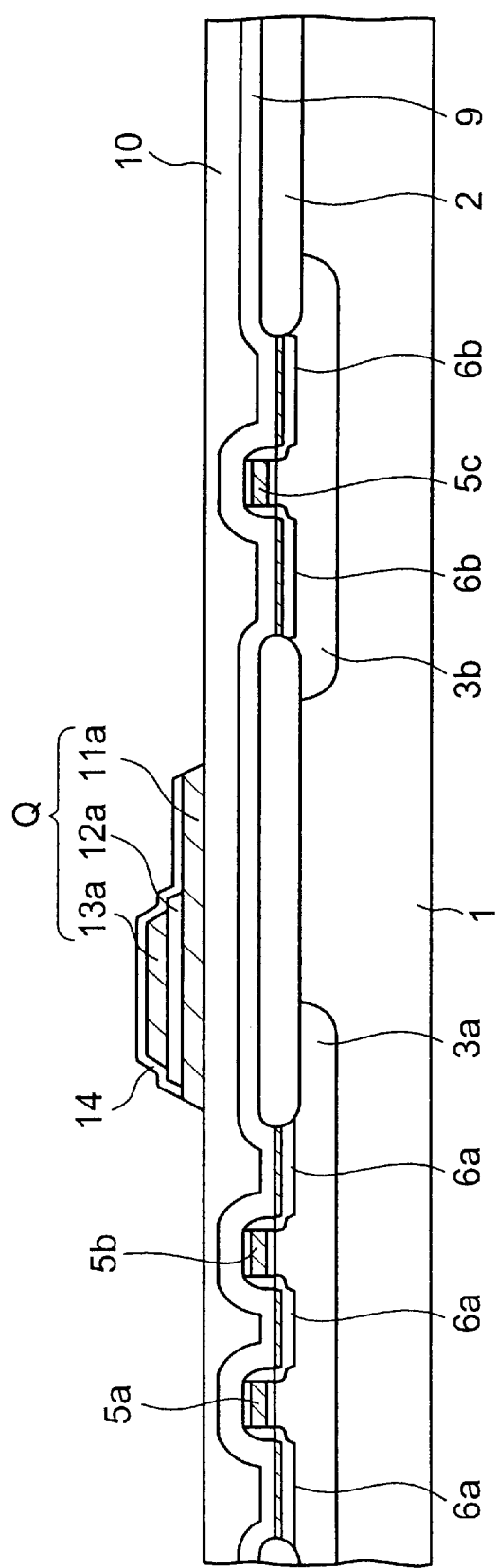

Accordingly, as shown in FIG. 5, the capacitor Q consisting of the lower electrode 11a, the dielectric film 12a, and the upper electrode 13a is formed on the first interlayer insulating film 10.

Figure 22:
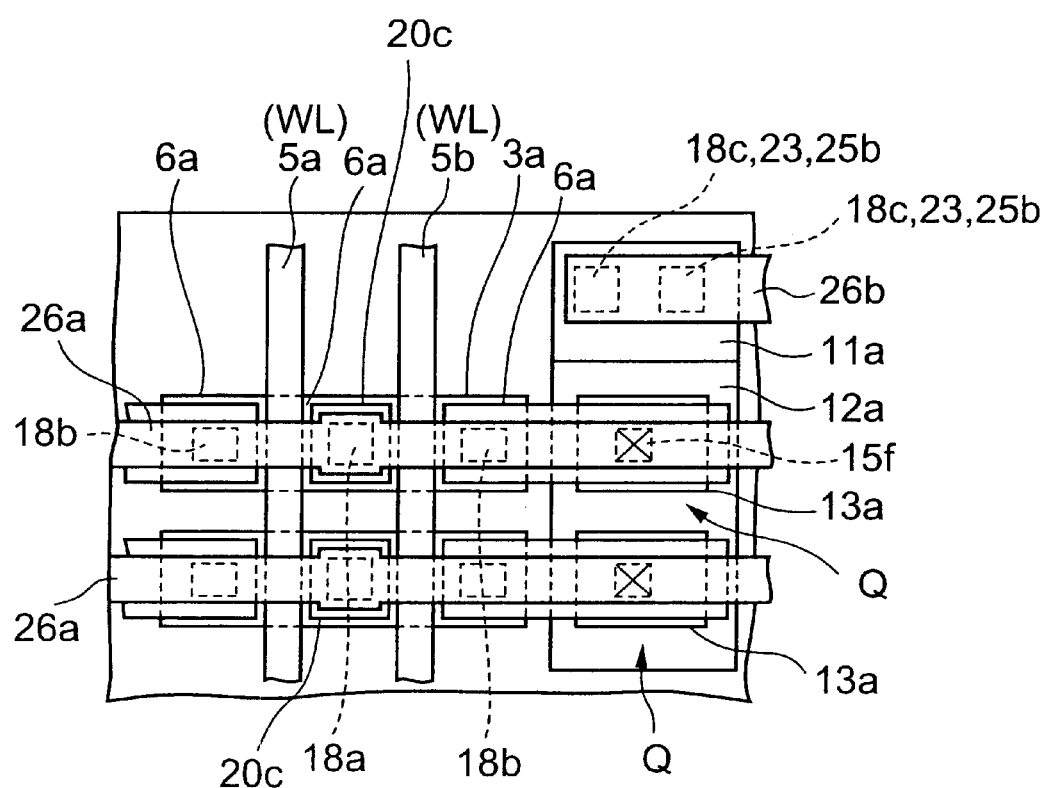
FIG. 22 is a plane view showing arrangement of conductive patterns in a memory cell region of the FeRAM as the semiconductor device according to the embodiment of the present invention.

A planar structure excepting the insulating film in the memory cell region A is shown in FIG. 22. A plurality of upper electrodes 13a are formed on one rectangular dielectric film 12a, and the lower electrode 11a under the dielectric film 12a has a size to extend up to the side of the dielectric film 12a. In FIG. 22, contact holes, bit lines, etc. described later are depicted.

Figure 6:
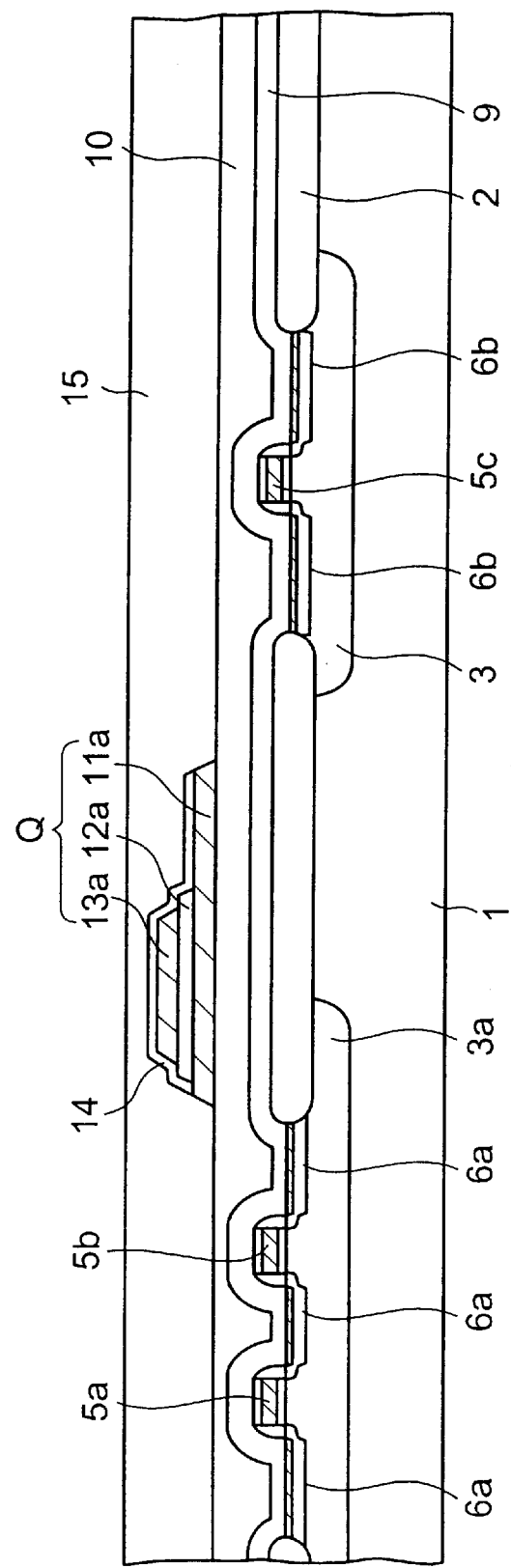

Then, as shown in FIG. 6, an $SiO_2$ film of 1200 nm thickness is formed as a second interlayer insulating film 15 on the capacitor Q and the first interlayer insulating film 10 by the CVD method, and then a surface of the second interlayer insulating film 15 is planarized by the CMP method. Upon the growth of the second interlayer insulating film 15, either the silane ($SiH_4$) or the TEOS may be used as a reaction gas.

The surface planarization of the second interlayer insulating film 15 is continued up to a thickness of 200 nm from the upper surface of the upper electrode 13a. The moisture in the slurry used in the planarization by the CMP method and the moisture in the cleaning liquid used in the later cleaning are stuck onto the surface of the second interlayer insulating film 15 or absorbed into the inside of the second interlayer insulating film 15. Therefore, the moisture stuck on the surface and in the inside of the second interlayer insulating film 15 is discharged by heating the second interlayer insulating film 15 at the temperature of 390° C. in a vacuum chamber (not shown). After such dehydration process, the improvement in the film quality as well as the dehydration is performed by exposing to the N$_2$O plasma while heating the second interlayer insulating film 15. As a result, the degradation of the capacitor caused by the heating in later steps and the moisture can be prevented.

Such dehydration process and the plasma process may be conducted in the same chamber (not shown). The supporting electrode on which the silicon substrate 1 is loaded and the opposing electrode opposed to the supporting electrode are arranged in the chamber, and a high frequency power supply can be connected to the opposing electrode. Then, after a N$_2$O gas is introduced into the chamber, first the dehydration process of the insulating film is performed not to apply the high frequency power supply to the opposing electrode, and then the N$_2$O plasma process of the insulating film is performed by applying the high frequency power supply N$_2$O to the opposing electrode to generate the N$_2$O plasma between the electrodes. According to such N$_2$O plasma process, nitrogen is contained in at least the surface of the insulating film. Such method is employed in the dehydration and plasma processes described later. It is preferable to use the N$_2$O plasma in the plasma process following to the dehydration process, but the NO plasma, the N$_2$ plasma, etc. may be used. This is also true of the steps described later. The substrate temperature in the dehydration process is substantially identical to the substrate temperature in the plasma process.

Figure 7:
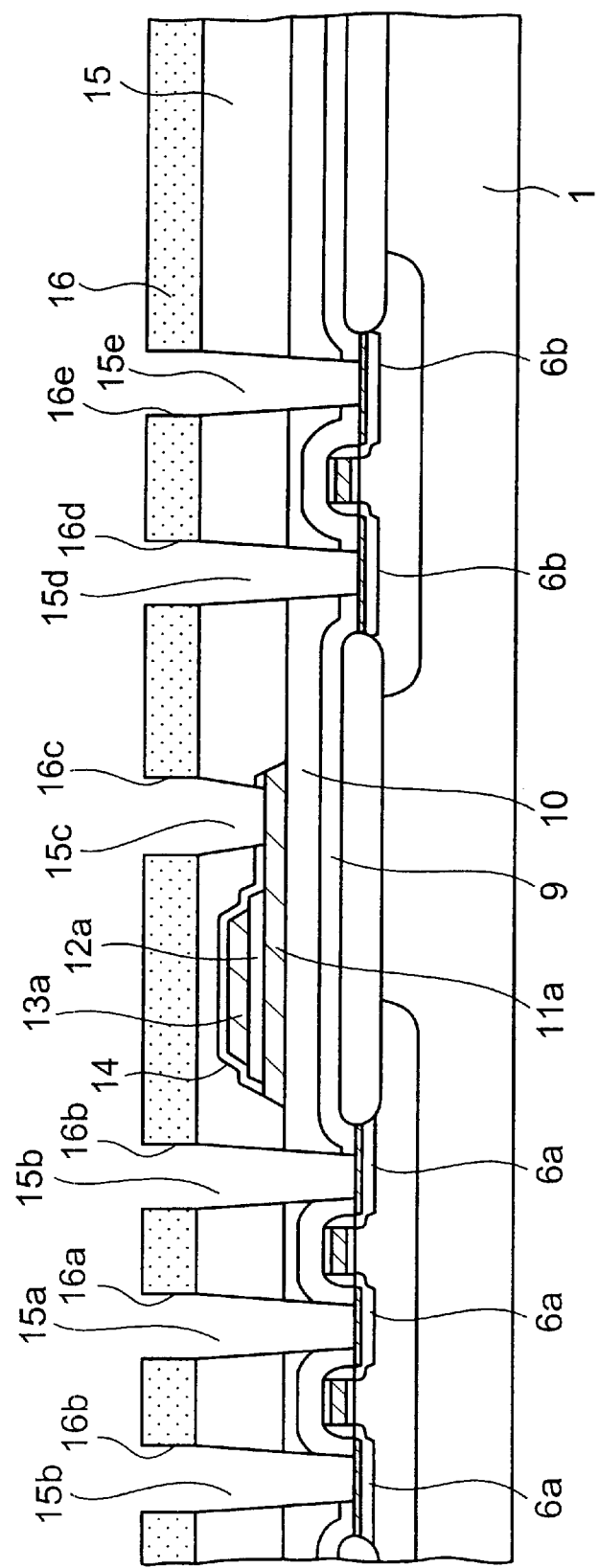

Then, as shown in FIG. 7, hole forming windows 16a to 16e are formed on the impurity diffusion layers 6a and the lower electrode 11a of the capacitor in the memory cell region A and on the impurity diffusion layers 6b in the peripheral circuit region B respectively by coating resist 16 on the second interlayer insulating film 15 and then exposing/developing it.

In turn, by etching the first interlayer insulating film 10, the second interlayer insulating film 15, and the cover film 9 by virtue of the dry etching, contact holes 15a to 15e are formed on the impurity diffusion layers 6a and the lower electrode 11a of the capacitor in the memory cell region A and also contact holes 15d, 15e are formed on the impurity diffusion layers 6b in the peripheral circuit region B. The first interlayer insulating film 10, the second interlayer insulating film 15, and the cover film 9 are etched by using a CF series gas, e.g., a mixed gas obtained by adding CF$_4$ and Ar to CHF$_3$.

In this etching, since the etching rate of the Al$_2$O$_3$ encapsulation layer 14 covering the lower electrode 11a of the capacitor is smaller than other insulating films, difference in the etching depths between the shallow contact hole 15c formed on the lower electrode 11a and other contact holes 15a, 15b, 15d, 15e can be absorbed by the encapsulation layer 14.

In this case, a ratio of etching rates of the SiO$_2$ films constituting the first interlayer insulating film 10 and the second interlayer insulating film 15, the SiON film constituting the cover film 9, and the Al$_2$O$_3$ film constituting the encapsulation layer 14 is given by 10:4:1 respectively.

Now, the contact holes 15a to 15e are formed like a taper shape that has a wide upper area and a narrow lower area. Respective diameters of the contact holes 15a, 15b, 15d, 15e on the impurity diffusion layers 6a, 6b are about 0.5 µm at the middle of the depth.

Figure 8:
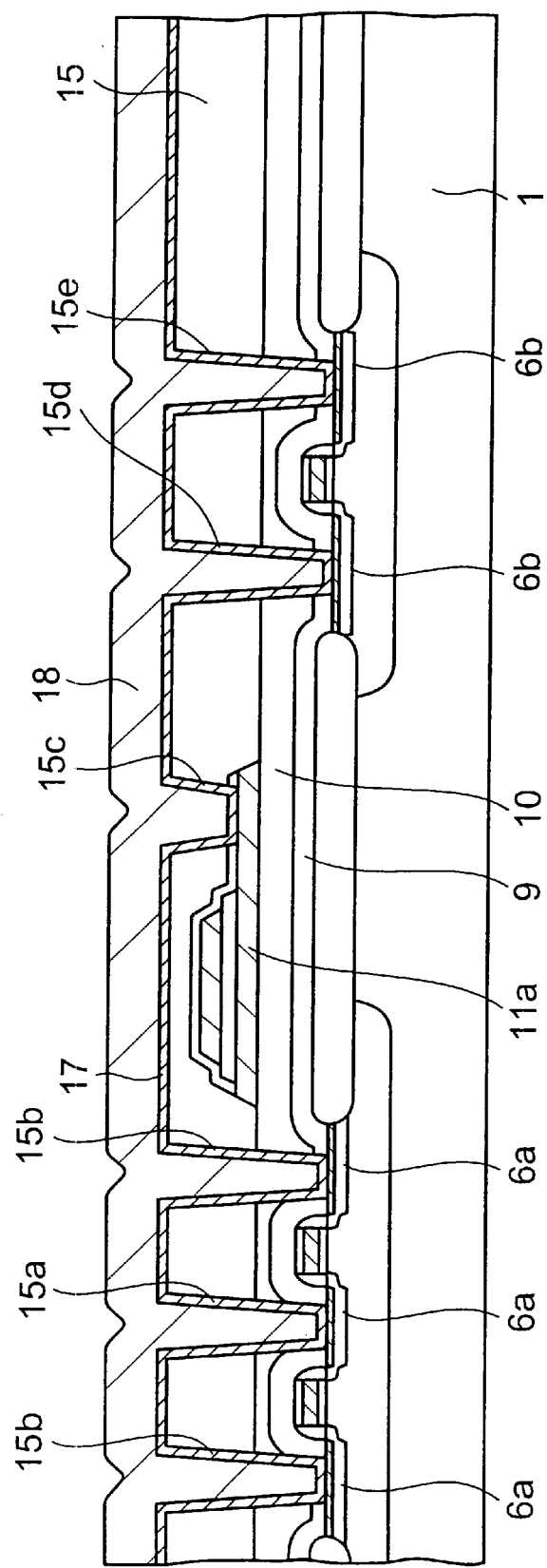

Then, as shown in FIG. 8, the resist 16 is removed, and then the upper surface of the second interlayer insulating film 15 and the inner surfaces of the contact holes 15a to 15e are etched as the Rf pretreatment. Then, a titanium (Ti) film of 20 nm thickness and a titanium nitride (TiN) film of 50 nm thickness are formed on them by the sputtering method, and these films are used as an adhesion layer 17. Then, a tungsten film 18 is formed on the adhesion layer 17 by the CVD method using a mixed gas of a tungsten fluoride (WF$_6$) gas, argon, and hydrogen. In this case, the silane (SiH$_4$) gas is also used in the initial grow of the tungsten film 18. A thickness of the tungsten film 18 is set to bury perfectly the contact holes 15a to 15e, e.g., about 500 nm on the second interlayer insulating film 15.

Since the contact holes 15a to 15e are formed as the taper shape respectively, a cavity (also called a blowhole or a void) is difficult to be formed in the tungsten film 18 buried in them.

Figure 9:
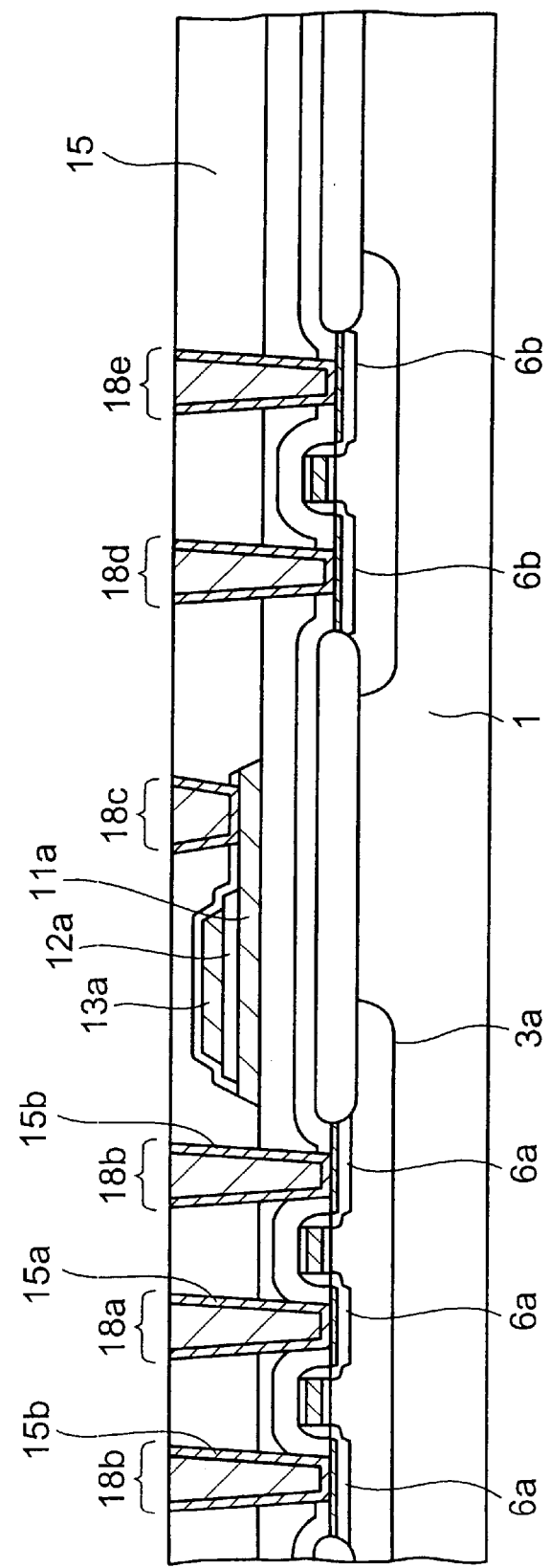

Then, as shown in FIG. 9, the tungsten film 18 and the adhesion layer 17 are removed from the upper surface of the second interlayer insulating film 15 by means of the CMP method, but they are left only in the contact holes 15a to 15e. Thus, the tungsten film 18 and the adhesion layer 17 in the contact holes 15a to 15e are used as plugs 18a to 18e. In this case, if the etching back is used in place of the CMP method, different etching gases are required for the etching of the tungsten film 18 and the etching of the adhesion layer 17 respectively and thus the etching management requires much time and labor.

In one p-well 3a in the memory cell region A, the first plug 18a on the n-type impurity diffusion region 6a that is put between two gate electrodes 5a, 5b is connected to the bit line described later, and two remaining second plugs 18b are connected to the upper electrode 13a of the capacitor Q via the wiring described later. Then, as shown in FIG. 22, the contact hole 15c and the plug 18c located on the lower electrode 11a are formed on the outside of the dielectric film 12a. But, in order to facilitate the understanding, the plug 18c is depicted for convenience in FIG. 9 and succeeding figures to locate on a prolonged line from a plurality of plugs 18a, 18b formed on the impurity diffusion layers 6a in the memory cell region A.

Then, in order to remove the moisture adhered to the surface of the second interlayer insulating film 15 or penetrated into the inside thereof in the cleaning process performed after the formation of the contact holes 15a to 15e, the cleaning process performed after the CMP, etc., the second interlayer insulating film 15 is heated at the temperature of 390° C. in the vacuum chamber to discharge the moisture to the outside. After such dehydration process, the annealing of the second interlayer insulating film 15 is carried out for two minutes, for example, to improve the film quality by exposing the second interlayer insulating film 15 to the N$_2$ plasma while heating it. Here, the reasons for the employment of the N$_2$ plasma in lieu of the N$_2$O plasma are to prevent the etching of the tungsten film 18 in the contact holes 15a to 15e, prevent the deterioration of the capacitor by the dehydration, and prevent the peeling-off of the films constituting the capacitor Q by the thermal stress. Such peeling-off of the films is caused by the difference in thermal stresses between the films constituting the capacitor Q and their neighboring films, etc.

Figure 10:
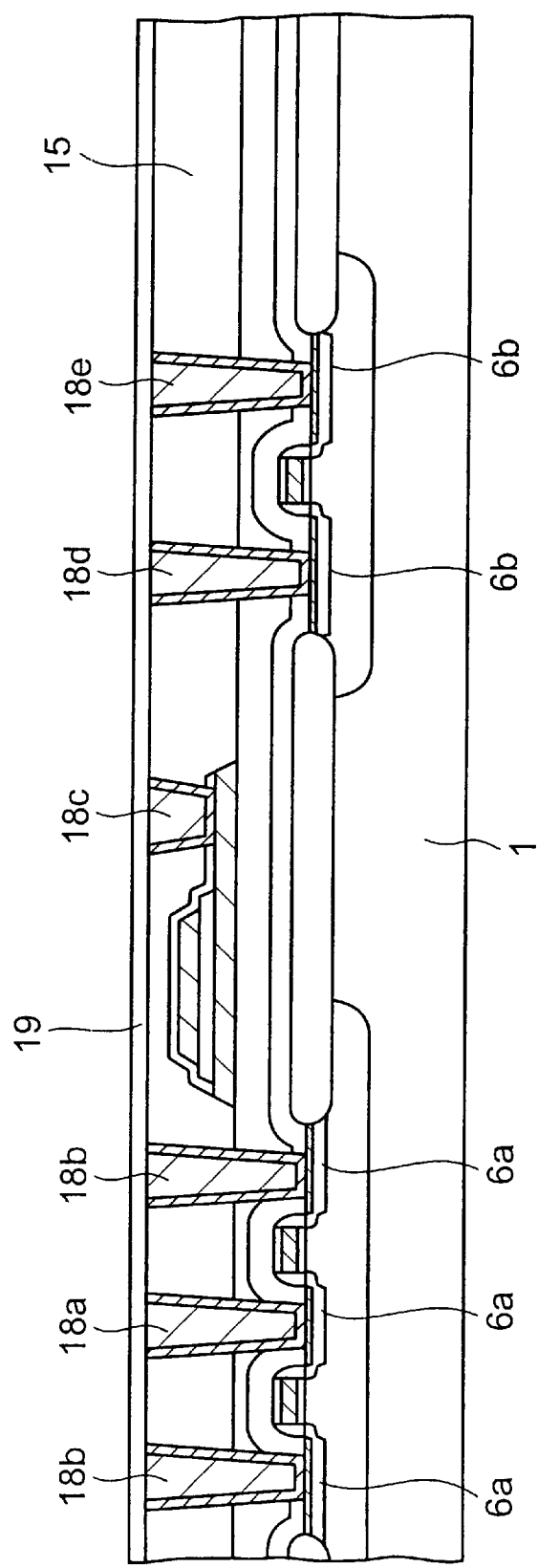

In turn, as shown in FIG. 10, an SiON film of 100 nm thickness, for example, is formed on the second interlayer insulating film 15 and the plugs 18a to 18e by the plasma CVD method. This SiON film is formed by using a mixed gas of the silane (SiH$_4$) and the N$_2$O, and is used as an oxidation preventing film 19 to prevent the oxidation of the plugs 18a to 18e.

The gas seeds used in the plasma annealing of the second interlayer insulating film 15 and constituent material of the oxidation preventing film are selected based on following experimental comparison results. That is, as shown in Table 1, the silicon nitride (SiN) film, that is formed as the oxidation preventing film by the plasma CVD method using $N_2O$ as the gas in the plasma annealing, or the silicon nitride (SiN) film, that is formed by the ECRCVD method without the pretreatment of the annealing, has an oxidation preventing function respectively, nevertheless they are not preferable since the film peeling-off is caused in the capacitor Q. Also, when the silicon oxide ($SiO_2$) film, that is formed by the plasma CVD method using TEOS while using $N_2O$ as the gas in the plasma annealing, is used as the oxidation preventing film, such the silicon oxide film does not have the oxidation preventing function for the plugs 18a to 18e. In addition, when the silicon oxide nitride (SiON) film, that is formed by the plasma CVD method without the pretreatment of the annealing, is used as the oxidation preventing film, the film peeling-off is caused in the capacitor Q.

In contrast, when the silicon oxide nitride film, that is formed by the plasma CVD method using $N_2$ as the gas in the plasma annealing, is used as the oxidation preventing film, such the silicon oxide nitride film has the oxidation preventing function for the plugs 18a to 18e and the film peeling-off is not caused in the capacitor Q.

As shown in Table 1, if the $N_2O$ plasma annealing is performed for 1.5 to 2.0 minutes, for example, the dehydration effect is large but the tungsten film 18 and the adhesion layer 17 constituting the plugs 18a to 18e are readily oxidized. In this case, as the gas in the plasma annealing, other inert gas, e.g., argon, neon, or helium in addition to nitrogen may be employed.

TABLE 1

| Pretreatment | Oxidation preventing film | Peeling-off | Oxidation |
| --- | --- | --- | --- |
| $N_2O$ annealing 2 min | P-SiN 100 nm | Occurred | Not occurred |
| No annealing | ECR-SiN 100 nm | Occurred | Not occurred |
| $N_2O$ annealing 2 min | TEOS 100 nm | Not occurred | Occurred |
| No annealing | SiON 100 nm | Occurred | Not occurred |
| $N_2$ annealing 2 min | SiON 100 nm | Not occurred | Not occurred |

Figure 11:
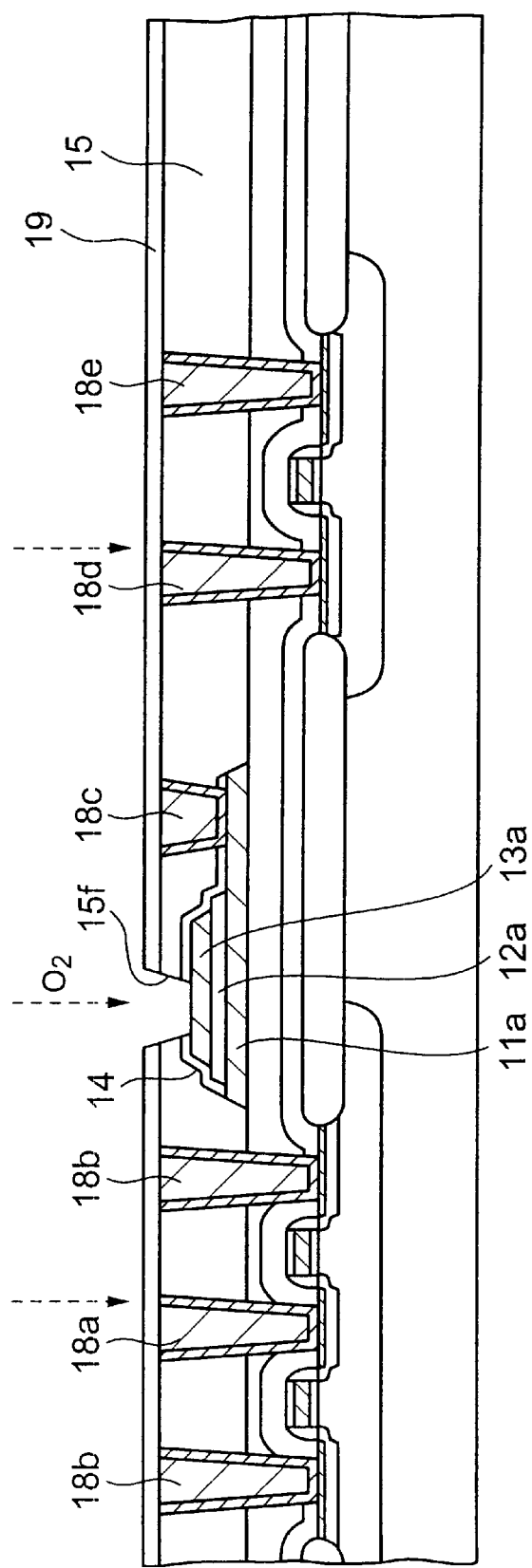

Then, as shown in FIG. 11, a contact hole 15f is formed on the upper electrode 13a of the capacitor Q by patterning the encapsulation layer 14 and the second interlayer insulating film 15 by means of the photolithography method.

Then, the film quality of the dielectric film 12a is improved by annealing the dielectric film 12a of the capacitor Q at 550° C. for 60 minutes in the oxygen atmosphere. In this case, the oxidation of the plugs 18a to 18e is prevented by an oxidation preventing film 19.

Figure 12:
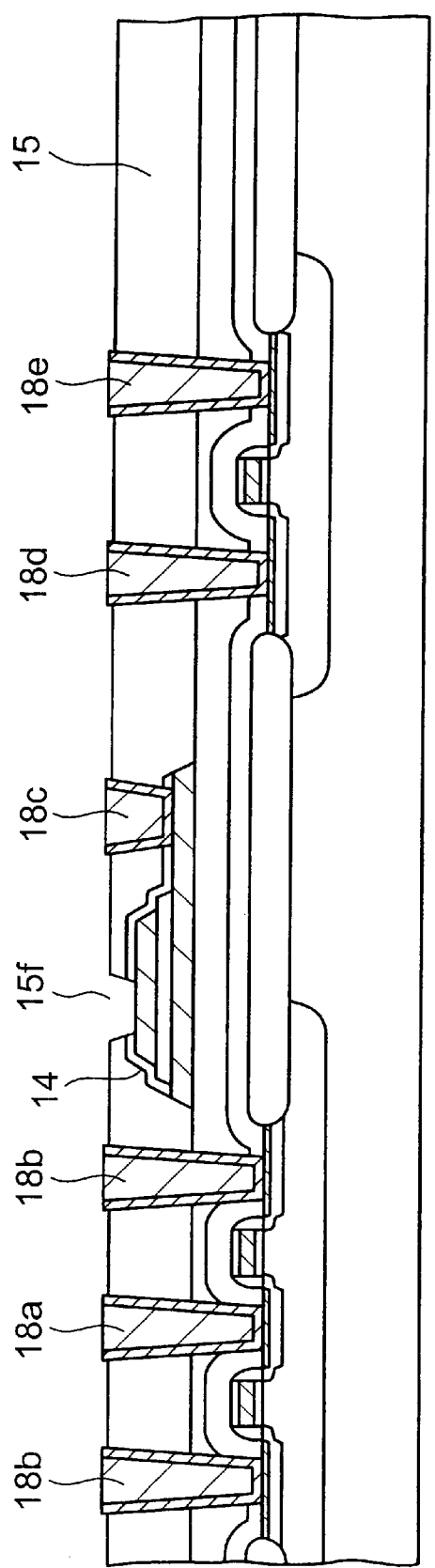

Then, as shown in FIG. 12, the SiON oxidation preventing film 19 is etched by the dry etching using the CF series gas. Since it is difficult to etch selectively the oxidation preventing film 19 to the second interlayer insulating film 15, such second interlayer insulating film 15 is etched slightly in etching the oxidation preventing film 19. As a result, the plugs 18a to 18e are brought into the state to protrude slightly from the upper surface of the second interlayer insulating film 15.

Figure 13:
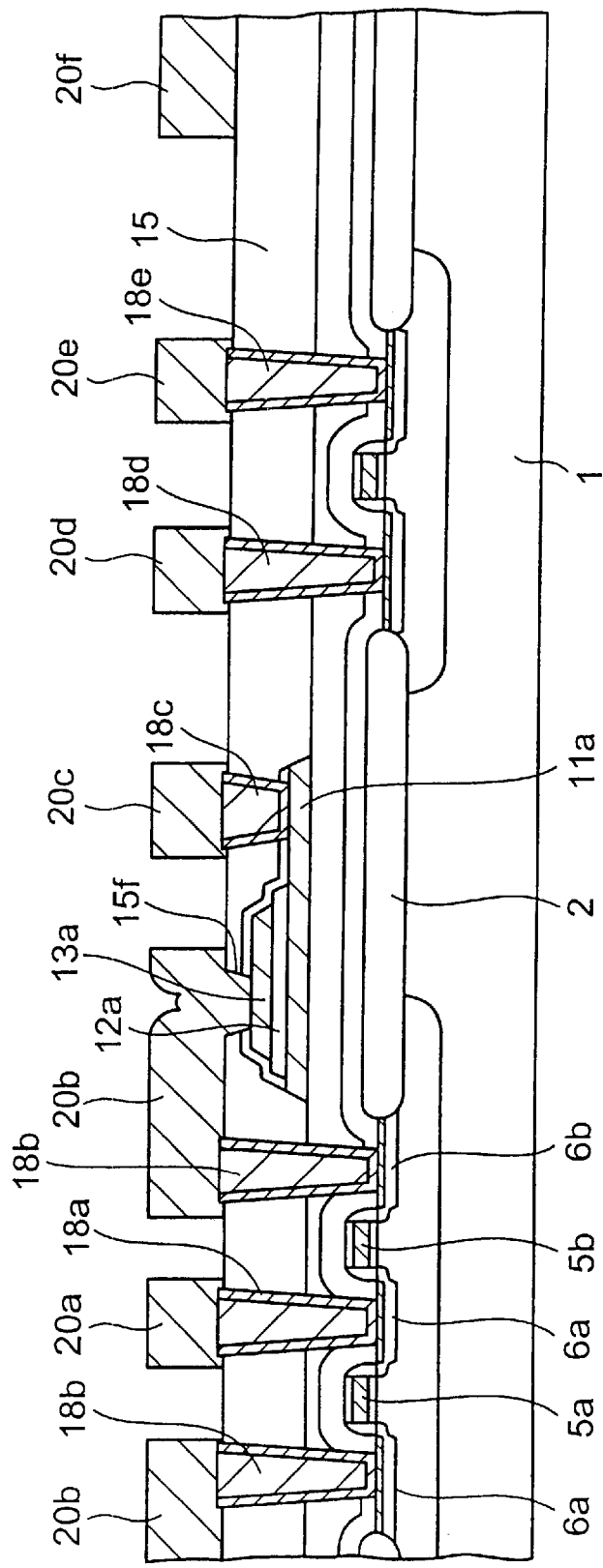

Then, a clear surface is exposed by etching respective surfaces of the plugs 18a to 18e and the upper electrode 13a by about 10 nm by virtue of the RF etching method. Then, as shown in FIG. 13, a conductive film having a quadruple-layered structure containing aluminum is formed on the second interlayer insulating film 15, the plugs 18a to 18e, and the contact hole 15f of the capacitor Q by the sputter method. The conductive film consists of a titanium nitride film of 50 nm thickness, a copper-containing (0.5%) aluminum film of 500 nm thickness, a titanium film of 5 nm thickness, and a titanium nitride film of 100 nm thickness in sequence from the bottom.

Then, as shown in FIG. 13, contact pads 20a, 20c and first layer wirings 20b, 20d to 20f are formed by patterning the conductive film by means of the photolithography method.

Now, a contact pad 20a is formed on the plug 18a between two gate electrodes 5a, 5b on the p-well 3a in the memory cell region A. Also, the plugs 18b located between the device isolation insulating film 2 and the gate electrodes 5a, 5b are connected to the upper electrode 13a of the capacitor Q via a wiring 20b through the contact hole 15f. In addition, another contact pad 20c is formed on the plug 18c on the lower electrode 11a of the capacitor Q, as the arrangement shown in FIG. 22.

The resist pattern used in the photolithography method is removed after the contact pad 20a, the wiring 20b, etc. are formed.

Figure 14:
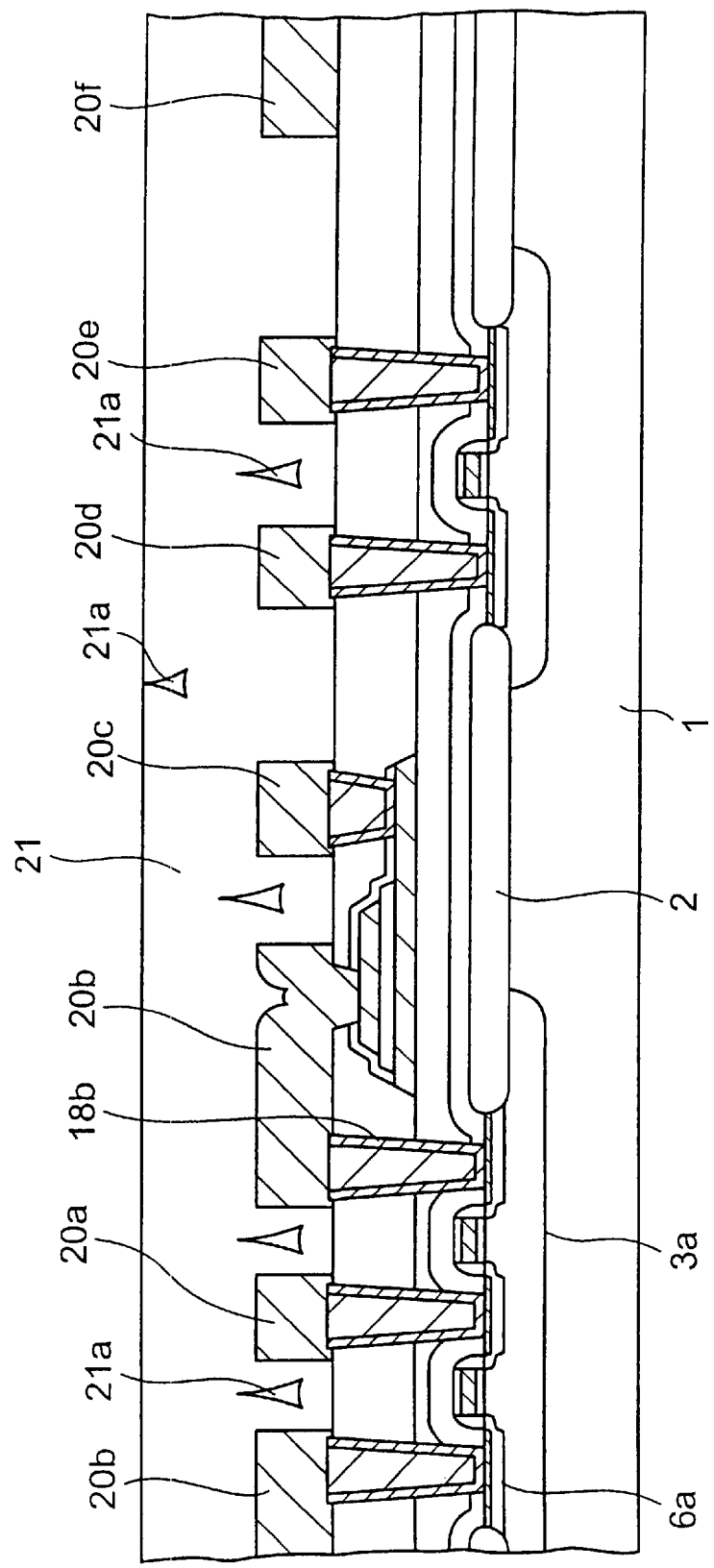

Then, as shown in FIG. 14, an $SiO_2$ film of 2300 nm thickness is formed as a third interlayer insulating film 21 by the plasma CVD method using TEOS as the source gas. The second interlayer insulating film 15, the contact pads 20a, 20c, the wiring 20b, etc. are covered with the third interlayer insulating film 21. Then, a surface of the third interlayer insulating film 21 is planarized by the CMP method.

Thereafter, the moisture is discharged to the outside by heating the third interlayer insulating film 21 at the temperature of 390° C. in the vacuum chamber. After such dehydration process, the improvement in the film quality of the third interlayer insulating film 21 as well as the dehydration is carried out by exposing it to the N2O plasma while annealing.

In the meanwhile, the third interlayer insulating film 21 that is formed by the plasma CVD method using TEOS has poor coverage, and thus a cavity (blowhole) 21a is formed in the third interlayer insulating film 21. The cavities 21a are generated between the wirings 20b, 20d to 20f and the pads 20a, 20c, and the position of the cavity 21a becomes higher as the intervals between them become larger. Then, a part of the cavities 21a is exposed by the planarizing process of the third interlayer insulating film 21. There is such a possibility that, if the conductive material is filled into the cavities 21a, a plurality of wirings formed on the third interlayer insulating film 21 are short-circuited via the cavity 21a.

Figure 15:
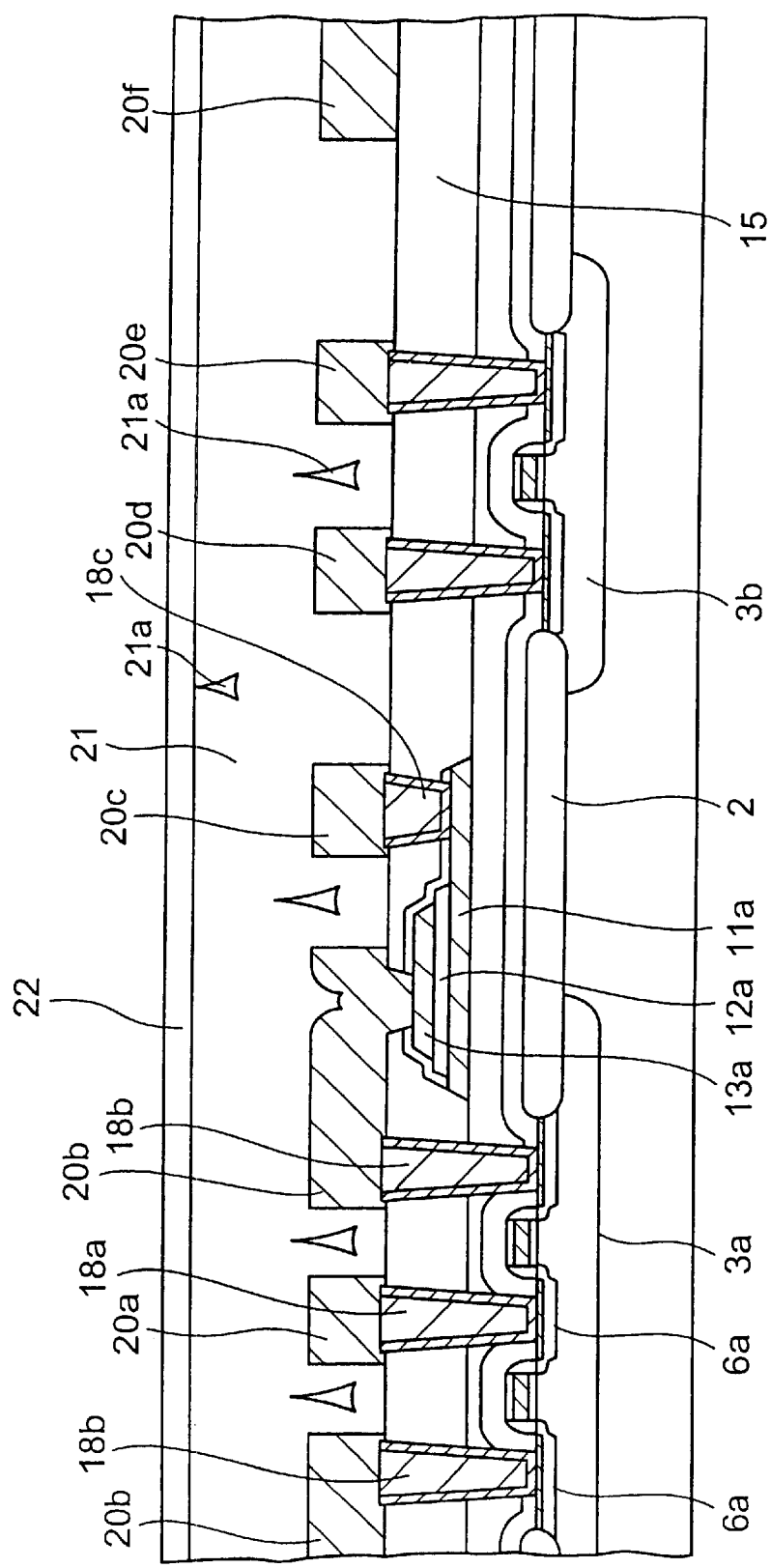

Therefore, as shown in FIG. 15, a protection insulating film 22 made of $SiO_2$ having a thickness of more than 100 nm is formed on the third interlayer insulating film 21 by the plasma CVD method using TEOS to thus cover the cavities 21a. After this, the dehydration process of the protection insulating film 22 is executed at the temperature of 390° C. in the vacuum chamber, and then the dehydration and the improvement in the film quality are performed by exposing it to the $N_2O$ plasma while heating.

Figure 16:
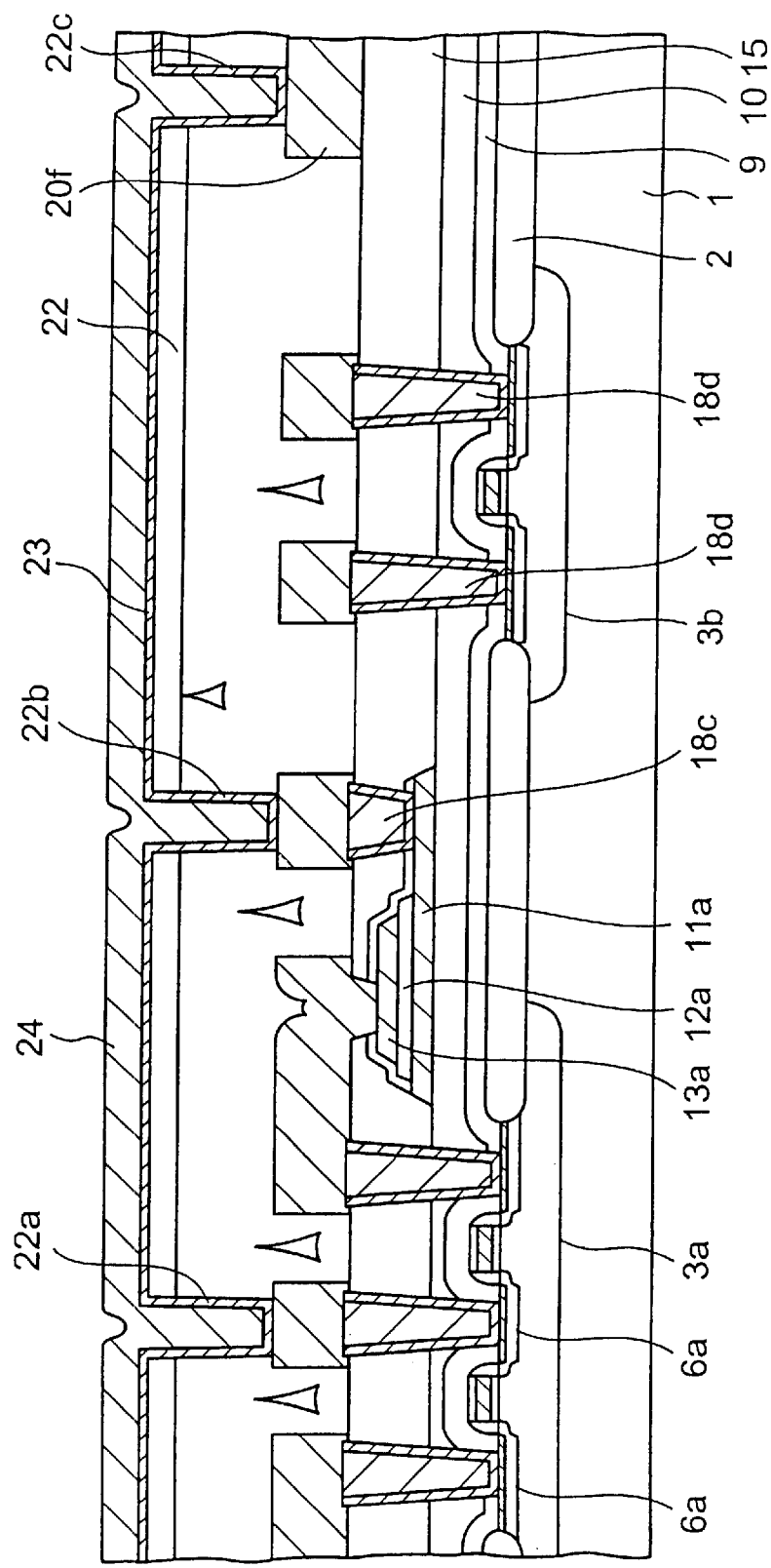

Next, steps required to get the structure shown in FIG. 16 will be explained hereunder.

First, holes 22a to 22c are formed on the contact pad 20a formed in the middle of the p-well 3a in the memory cell region A, the wiring 20c on the lower electrode 11a of the capacitor Q, and the wiring 20f in the peripheral circuit region B by patterning the third interlayer insulating film 21 and the protection insulating film 22 by virtue of the photolithography method.

Then, after the Rf pretreatment etching is applied to the upper surface of the protection insulating film 22 and the inner surfaces of the holes 22a to 22c, an adhesion layer 23 made of a titanium nitride (TiN) film having a thickness of 90 to 150 nm is formed by the sputter method, and then a blanket tungsten film 24 of 800 nm thickness, for example, is formed by the CVD method to bury the holes 22a to 22c. The source gas containing $WF_6$ and $H_2$ is employed in the growth of the blanket tungsten film 24. Now, the reason for that the thickness of the adhesion layer 23 is set to more than 90 nm is to relax the damage to the capacitor Q caused when the $H_2$ used in forming the relatively thick tungsten film 24 penetrates into the protection insulating film 22. As described above, since the tungsten film 18 shown in FIG. 8 is formed thin to fill into the contact holes 15a to 15f with a small diameter, a thickness of the overlying TiN adhesion layer 17 may be formed thin such as 50 nm.

Figure 17:
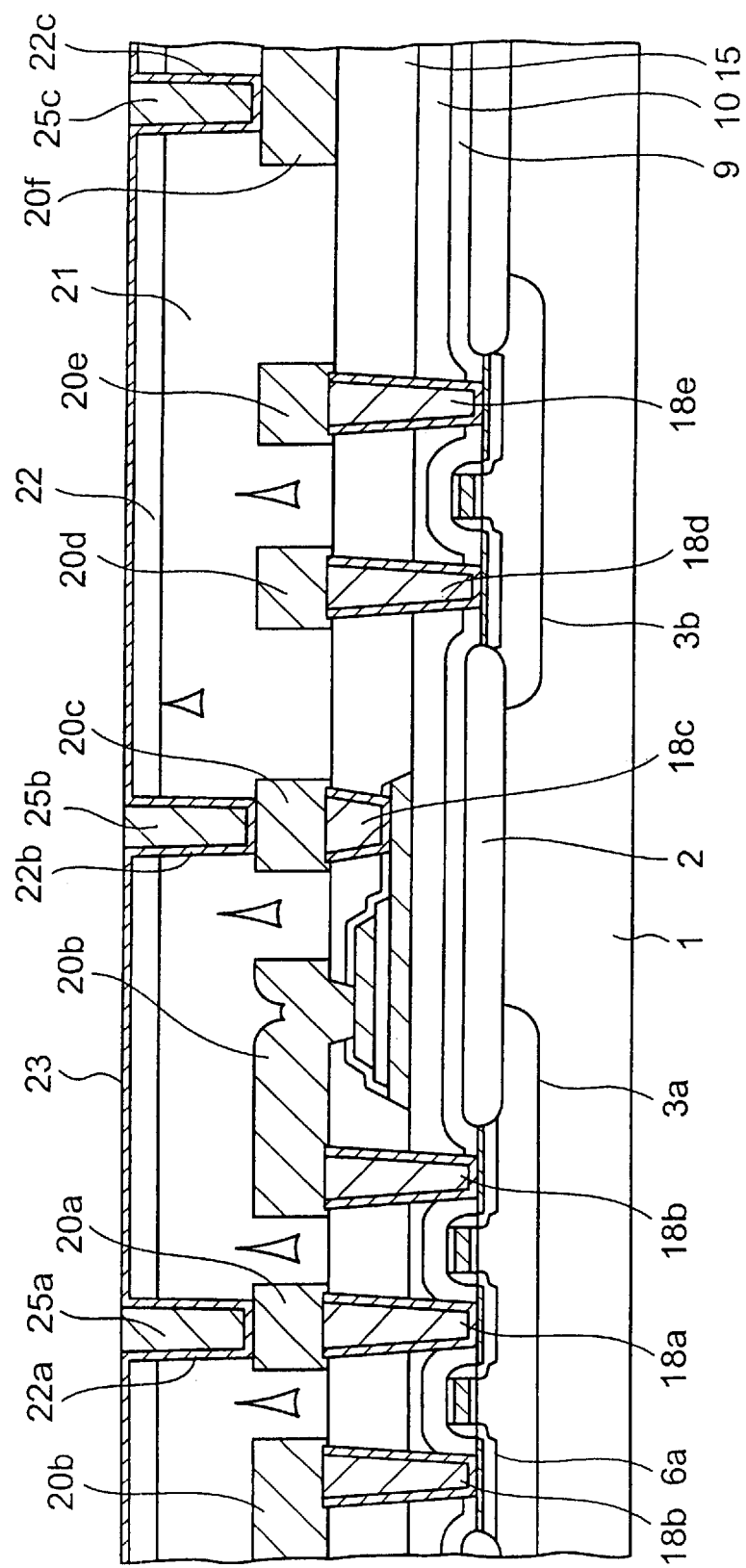

Then, as shown in FIG. 17, the blanket tungsten film 24 is etched back to leave only in the holes 22a to 22c. Thus, the blanket tungsten film 24 in the holes 22a to 22c is used as second layer plugs 25a to 25c. Accordingly, the TiN adhesion layer 23 is left on the protection insulating film 22.

Figure 18:
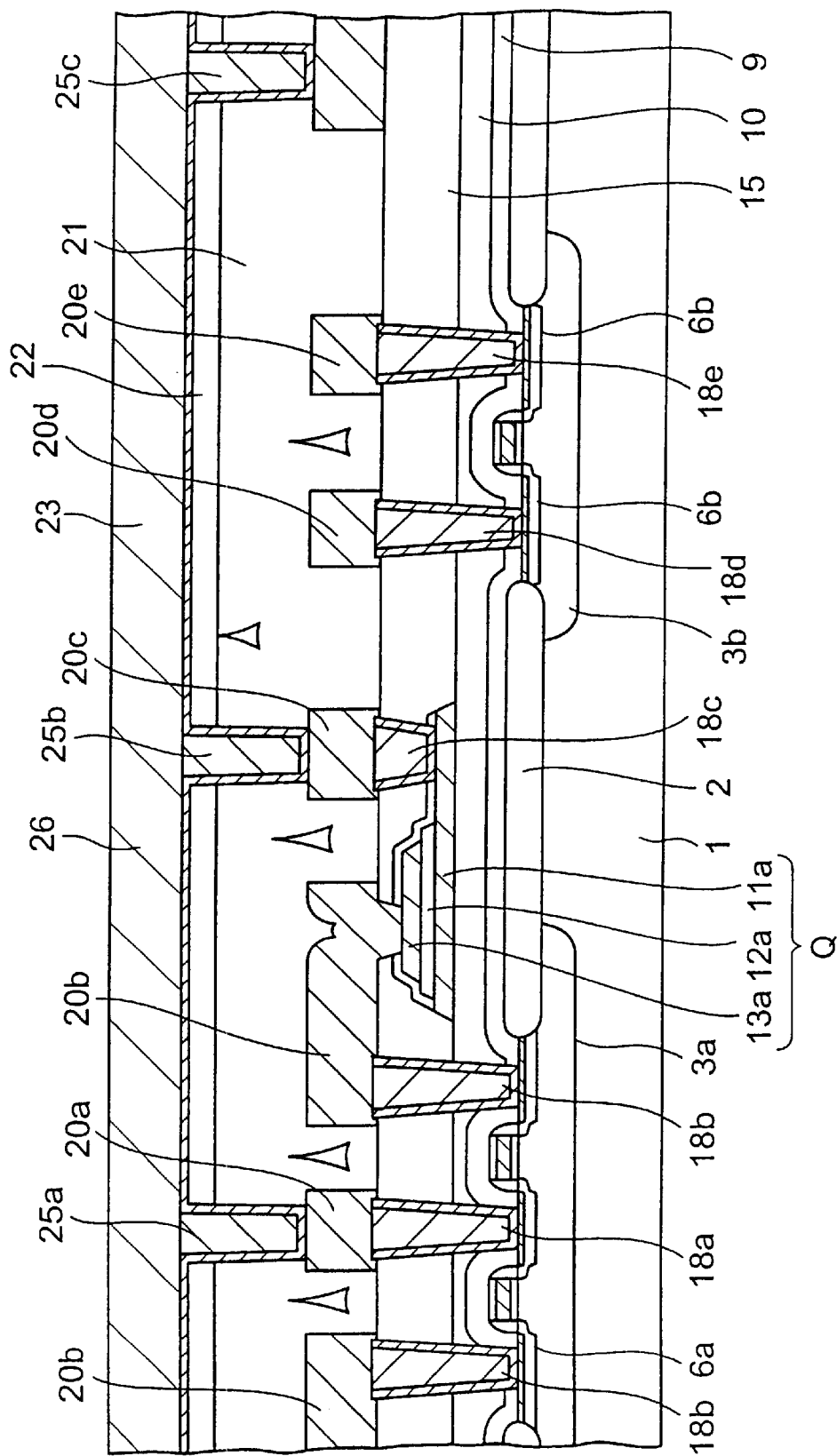

Then, as shown in FIG. 18, a conductive film 26 having a triple-layered structure is formed on the TiN adhesion layer 23 and the plugs 25a to 25c by the sputter method. The conductive film 26 consists of a copper-containing (0.5%) aluminum film of 500 nm thickness, a titanium film of 5 nm thickness, and a titanium nitride film of 100 nm thickness in sequence from the bottom.

Figure 19:
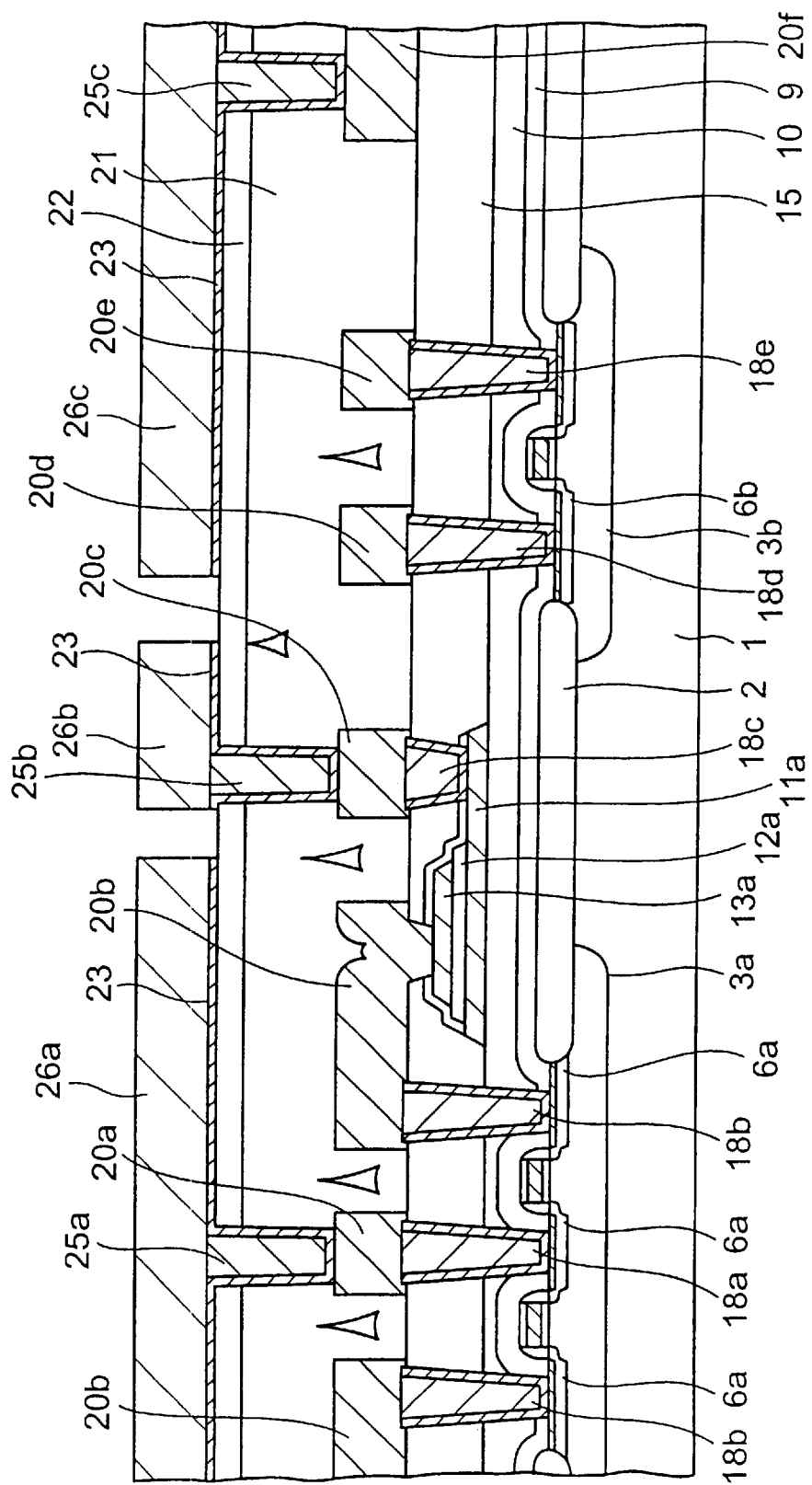

Then, as shown in FIG. 19, second layer contact pads and second layer aluminum wirings are formed by patterning the conductive film 26 by virtue of the photolithography method. For example, in the memory cell region A, a bit line 26a connected via the plugs 18a, 25a and the contact pad 20a is formed over the impurity diffusion layers 6a located in the center of the p-well 3a, and also a second layer wiring 26b connected via the plugs 18c, 25b and the contact pad 20c is formed over the lower electrode 11a of the capacitor Q. In addition, in the peripheral circuit region B, a second layer aluminum wiring 26c connected via the plug 25c is formed over the first layer aluminum wiring 20f. A plan view in this state is shown in FIG. 22.

Figure 20:
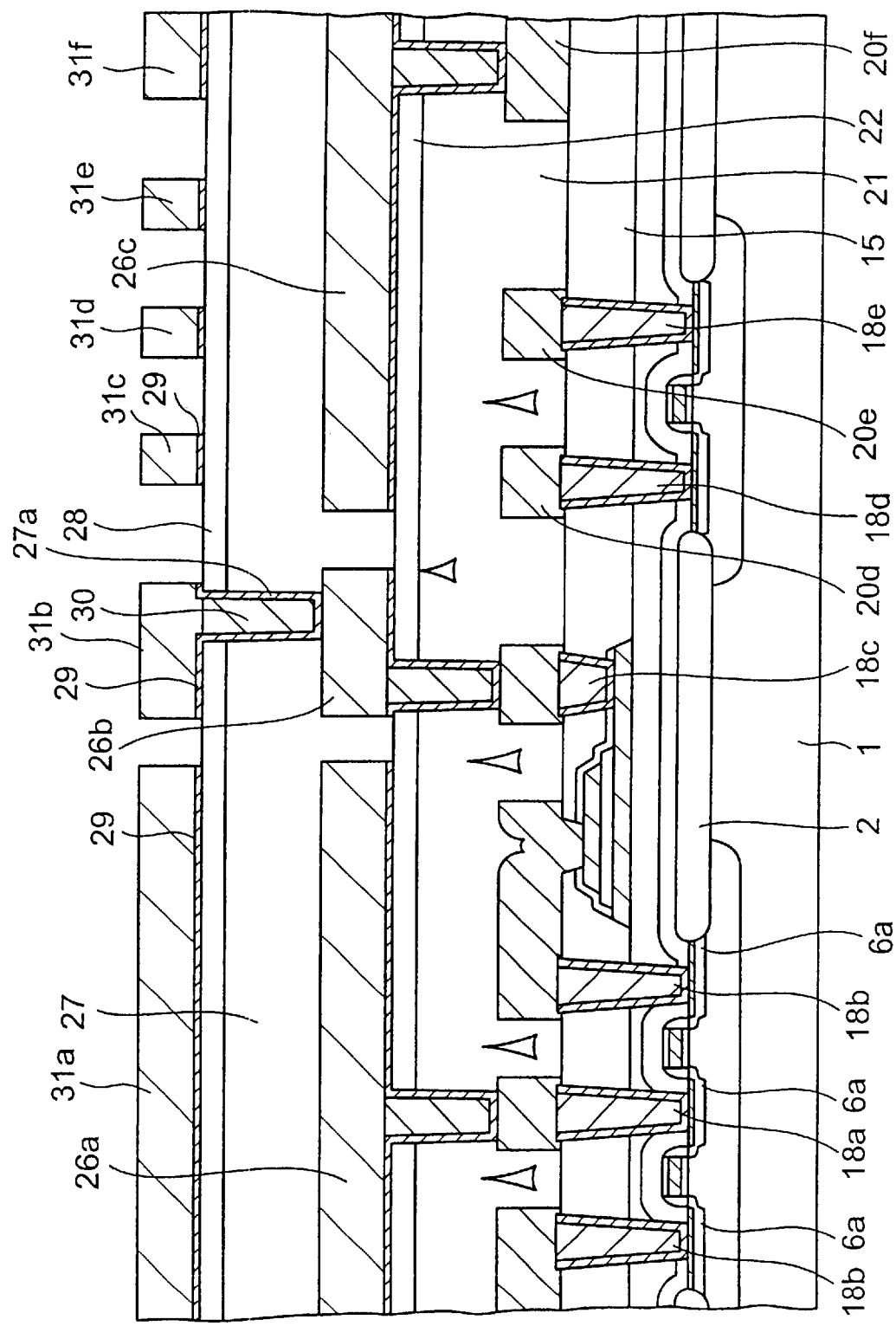

Then, the structure shown in FIG. 20 is formed by repeating the steps illustrated in FIG. 15 to FIG. 19.

First, an $SiO_2$ film of 2300 nm thickness is formed as a fourth interlayer insulating film 27 by the plasma CVD method using TEOS as the source gas. The protection insulating film 22 and the wirings 26a to 26c are covered with this fourth interlayer insulating film 27. Then, a surface of the fourth interlayer insulating film 27 is planarized by the CMP method. After this, the moisture is discharged to the outside by heating the fourth interlayer insulating film 27 at the temperature of 390° C. in the vacuum chamber. After such dehydration process, the film quality of the fourth interlayer insulating film 27 is improved by exposing it to the $N_2O$ plasma.

Then, an upper protection insulating film 28 made of $SiO_2$ and having a thickness of more than 100 nm is formed on the fourth interlayer insulating film 27 by the plasma CVD method using TEOS. Then, the dehydration process of the fourth interlayer insulating film 27 is performed at the temperature of 390° C. in the vacuum chamber, and also the film quality of the fourth interlayer insulating film 27 is improved by exposing it to the $N_2O$ plasma while heating it. In addition, a hole 27a is formed on the second layer aluminum wiring 26b, that is electrically connected to the lower electrode 11a of the capacitor Q, by patterning the fourth interlayer insulating film 27 and the protection insulating film 28 by virtue of the photolithography method. The resist mask is used in the photolithography method, but such mask is removed after the hole 27a is formed.

Then, an adhesion layer 29 made of titanium nitride (TiN) and having a thickness of 90 to 150 nm is formed on the upper surface of the protection insulating film 28 and the inner surface of the hole 27a by the sputter method. Then, a blanket tungsten film of 800 nm thickness is formed by the CVD method to bury the hole 27a. Then, the blanket tungsten film is etched back to leave only in the hole 27a, and thus the blanket tungsten film in the hole 27a is used as a third layer plug 30.

Accordingly, the TiN adhesion layer 29 is left on the protection insulating film 28.

Thereafter, a conductive film having a double-layered structure is formed on the adhesion layer 29 and the plug 30 by the sputter method. The conductive film consists of a copper-containing (0.5%) aluminum film of 500 nm thickness and a titanium nitride film of 100 nm thickness in sequence from the bottom. Then, third layer aluminum wirings 31a to 31c are formed by patterning the conductive film by virtue of the photolithography method.

Figure 21:
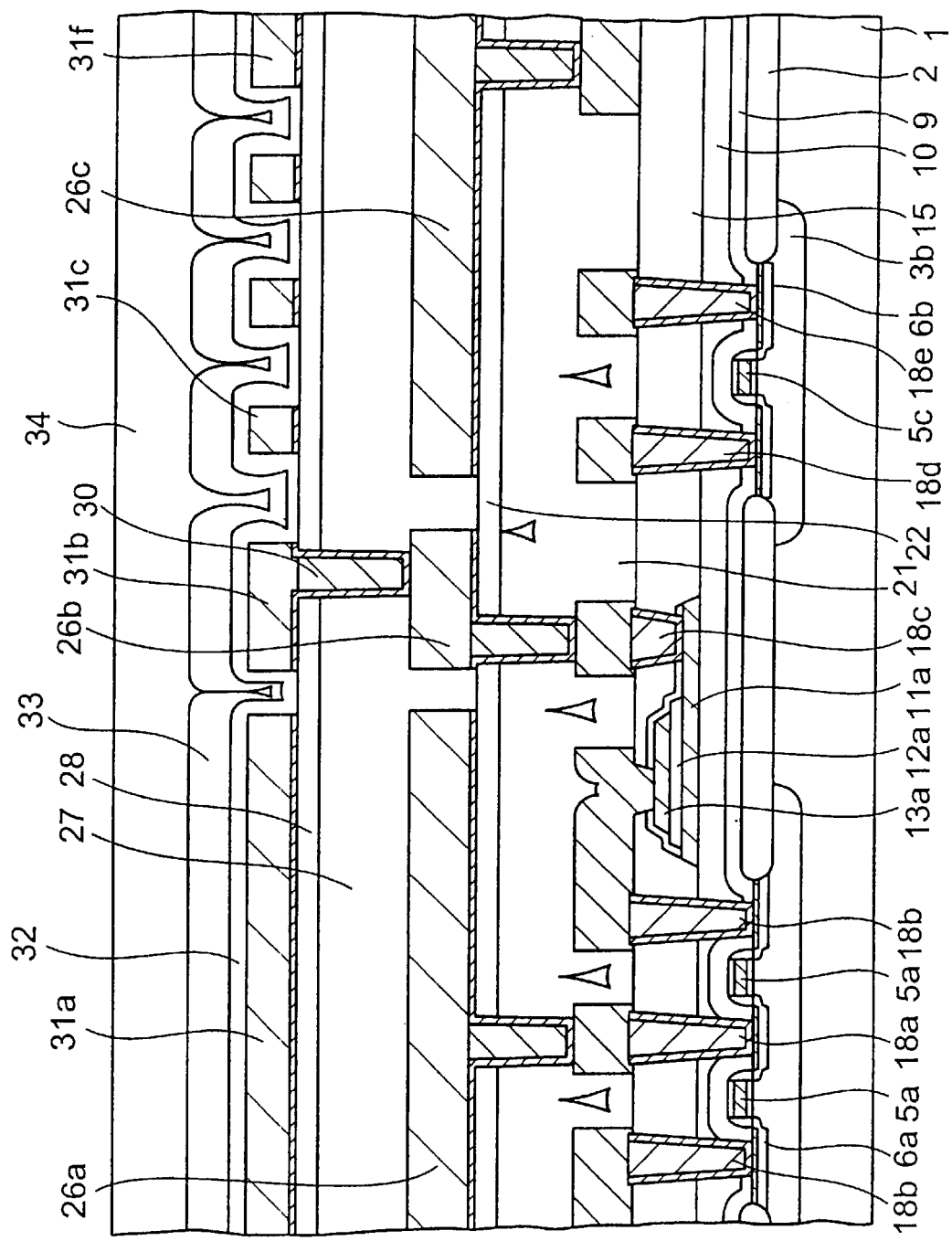

Then, as shown in FIG. 21, a protection insulating film 32 made of $SiO_2$ and having a thickness of 100 nm is formed by the plasma CVD method using TEOS as the source gas. Then, the moisture is discharged to the outside by heating the protection insulating film 32 at the temperature of 390° C. in the vacuum chamber. After such dehydration process, in addition to the dehydration, the film quality of the protection insulating film 32 is improved by exposing it to the $N_2O$ plasma.

Then, a silicon nitride film 33 of 350 nm thickness is formed on the protection insulating film 32 by the CVD method to block the entering of the moisture into the protection insulating film 32.

Then, a polyimide film is coated on the silicon nitride film 33 until a thickness of 3 $\mu$m and then baked at 230° C. for 30 minutes, and a resultant film is used as a cover film 34.

In the above embodiment, the first interlayer insulating film 10 is formed on the MOSFET formed on the silicon substrate 1, then the capacitor Q is formed thereon, then the second interlayer insulating film 15 is formed on the capacitor Q, and then the second interlayer insulating film 15 is planarized by the CMP method. Accordingly, in the condition that the surface of the second interlayer insulating film 15 is made flat, depths of the hole 15c on the lower electrode 11a and the hole 15f on the upper electrode 13a become different.

Therefore, the contact holes 15a to 15c are formed simultaneously on the impurity diffusion layers 6a serving as the source/drain of the MOSFET and on the lower electrode 11a of the capacitor Q in the memory cell region A respectively, and also the contact holes 15a to 15c are formed on the impurity diffusion layers 6b in the peripheral circuit region B by the same steps. Then, the plugs 18a to 18e are buried in the contact holes 15a to 15e, and then the contact hole 15f is formed on the upper electrode 13a of the capacitor Q.

In other words, the contact holes 15c, 15f are not simultaneously opened on the upper electrode 13a and the lower electrode 13b of the capacitor Q, but the hole 15c on the lower electrode 11a is formed simultaneously with the holes 15a, 15b on the impurity diffusion layers 6a and then plugs 18a to 18e are buried in the holes 15a to 15e and then the hole 15f is solely formed on the upper electrode 13a. Therefore, the degradation of the dielectric film 12a and the worsening of the capacitor characteristics caused when the hole 15f is formed on the upper electrode 13a can be prevented.

In addition, there is no necessity to add new steps for forming the hole 15c on the lower electrode 11a and filling the plug 18c into the hole 15c. Also, the contact holes 15a to 15f opened in the second interlayer insulating film 15 covering the capacitor Q and the MOSFET can be formed only by two pattering steps.

Further, the first layer aluminum layer 20b formed in the second interlayer insulating film 15 is directly connected, without the filling of the adhesion layer and the tungsten film into the contact hole 15f formed on the upper electrode 13a of the capacitor Q. Therefore, the damage of the capacitor that is caused by the reducing gas used in forming the tungsten film can be suppressed.

Moreover, the aluminum wiring 20b is connected to the upper electrode 13a of the capacitor to extend to the plugs 18b formed on the impurity diffusion layers 6a of the MOSFET. Therefore, the complication of the structure can be prevented.

Figure 23:
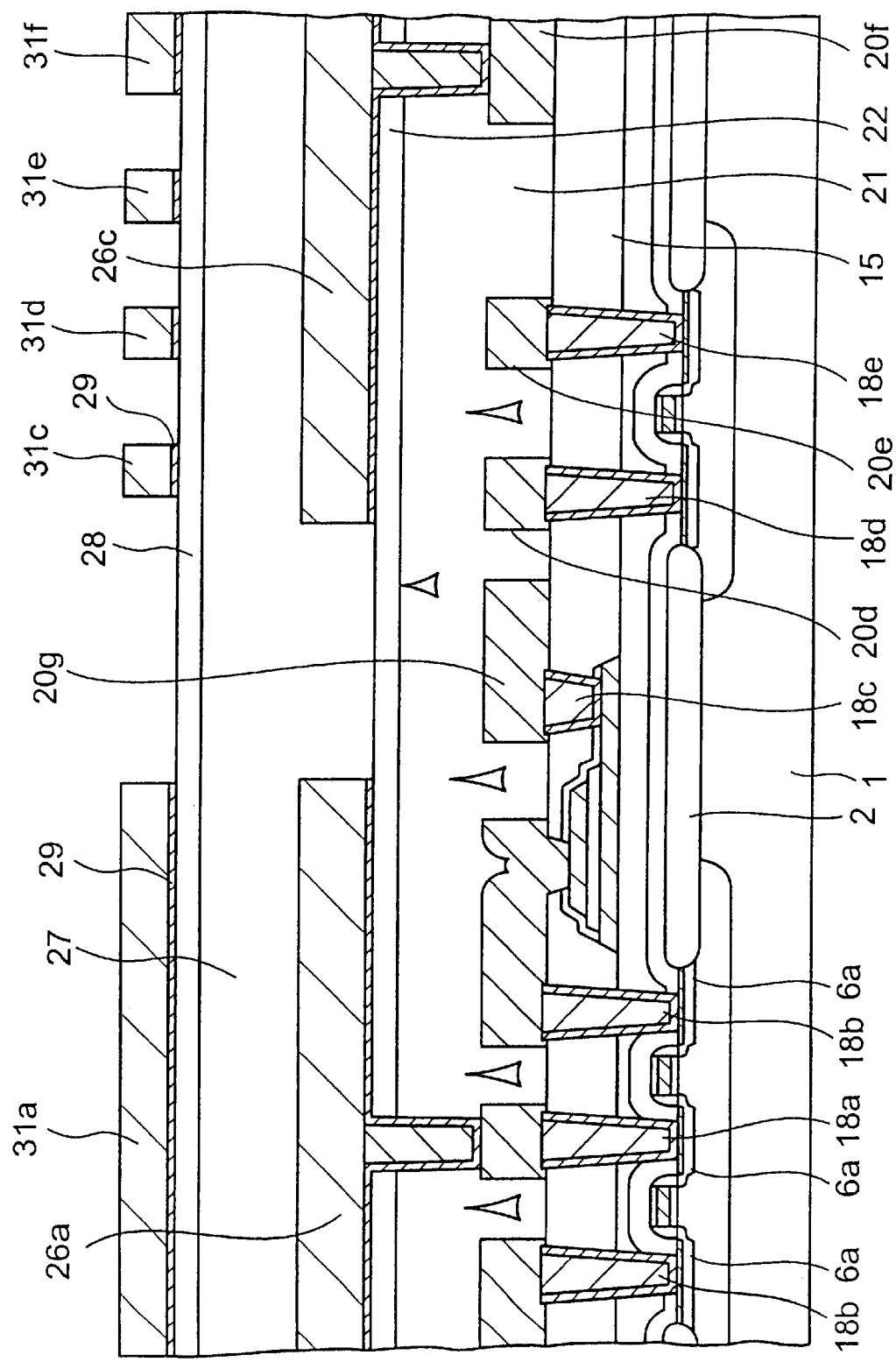
FIG. 23 is a sectional view showing another example of the FeRAM as the semiconductor device according to the embodiment of the present invention.

Meanwhile, in the above steps, the second layer wiring 26b is formed on the first layer plug 18c, that is connected to the lower electrode 11a of the capacitor Q, via the contact pads 20c, 26b and the plugs 25b, 30. In this case, as shown in FIG. 23, a structure in which the first layer aluminum layer 20g instead of the contact pad 20c is connected to the plug 18c may be employed. Accordingly, the contact pads 20c, 26b and the plugs 25b, 30 can be omitted.

By the way, in FIG. 10, in order to prevent the oxidation of the plugs 18a to 18e, the silicon nitride (SiN) film having the high oxygen blocking property is used as the oxidation preventing film 19. However, since $SiH_4$ is employed in forming the silicon nitride film by the plasma CVD method, the hydrogen is generated by plasma decomposition to accelerate the deterioration of the ferroelectric film 12. In addition, since the hydrogen is contained in the silicon nitride film, the hydrogen is also generated in etching the silicon nitride film and thus the characteristic of the ferroelectric film, recovered with much effort, is ready to be degraded.

However, it becomes apparent from Table 2 that, if the $SiO_2$ film of 100 nm thickness, formed by the plasma CVD method using the TEOS gas, is used in place of the SiON film, the capability for preventing the oxidation of the plugs 18a to 18e is small. In this case, the $SiO_2$ film formed by the plasma CVD method using the TEOS gas is also called a TEOS film in the following.

TABLE 2

| (A) | (B) | (C) | (D) |
|---|---|---|---|
| SiON film | 100 nm | 0 | 1913 |
| TEOS film | 50 nm | 42 | 10000 (range over) |
| TEOS film | 75 nm | 0 | 10000 (range over) |
| TEOS film | 100 nm | 0 | 10000 (range over) |

TABLE 2-continued

| (A) | (B) | (C) | (D) |
|---|---|---|---|
| TEOS film | 250 nm | 0 | 35 |
| TEOS film | 300 nm | 0 | 11 |

(A): Oxygen blocking film
(B): Film thickness (nm)
(C): W-plug oxidation number at RTA (850° C.)
(D): W-plug oxidation number (defect number) after the furnace (650° C. + 550° C.)

Table 2 gives the experimental results indicating the film seeds of the oxidation preventing film, the film thickness, and the oxidation conditions.

According to Table 2, it become apparent that the oxidation preventing function of the SiON film is high. Also, it becomes apparent that the TEOS film heated at 550° C. to 650° C. in the furnace has the high oxidation preventing capability if the film thickness is in excess of 250 nm. Accordingly, if the TEOS film is used as the oxidation preventing film 19 and is heated at 550° C. to 650° C., the film thickness is set to more than 250 nm. In addition, in order to prevent the oxidation of the tungsten plugs after the oxidation performed after RTA (850° C.), it is preferable to set the thickness of the TEOS oxidation preventing film to more than 75 nm. If the etching is performed by using the CF series gas, the etching time of the TEOS film having the 250 nm thickness is shorter than that of the SiON film having the 100 nm thickness by about 20%.

The results in Table 2 are given by measuring the defect number by using the KLA defect inspection measuring instrument. Thus, the defect number 1913 of SiON is not the oxidation number of the tungsten plugs, and is given by counting the defect occurred in the film by the annealing. Also, the measuring range over in Table 2 indicates that the oxidation number is extremely large.

The TEOS film in Table 2 is formed by the plasma CVD using the organic source gas, that uses the TEOS gas as material, at a single frequency or double frequencies in the temperature range of 300° C. to 500° C. It is preferable that the TEOS film should have the refractive index of 1.44 to 1.48 and the stress value of more than $1 \times 10^8$ dyne/cm$^2$.

Figure 24:
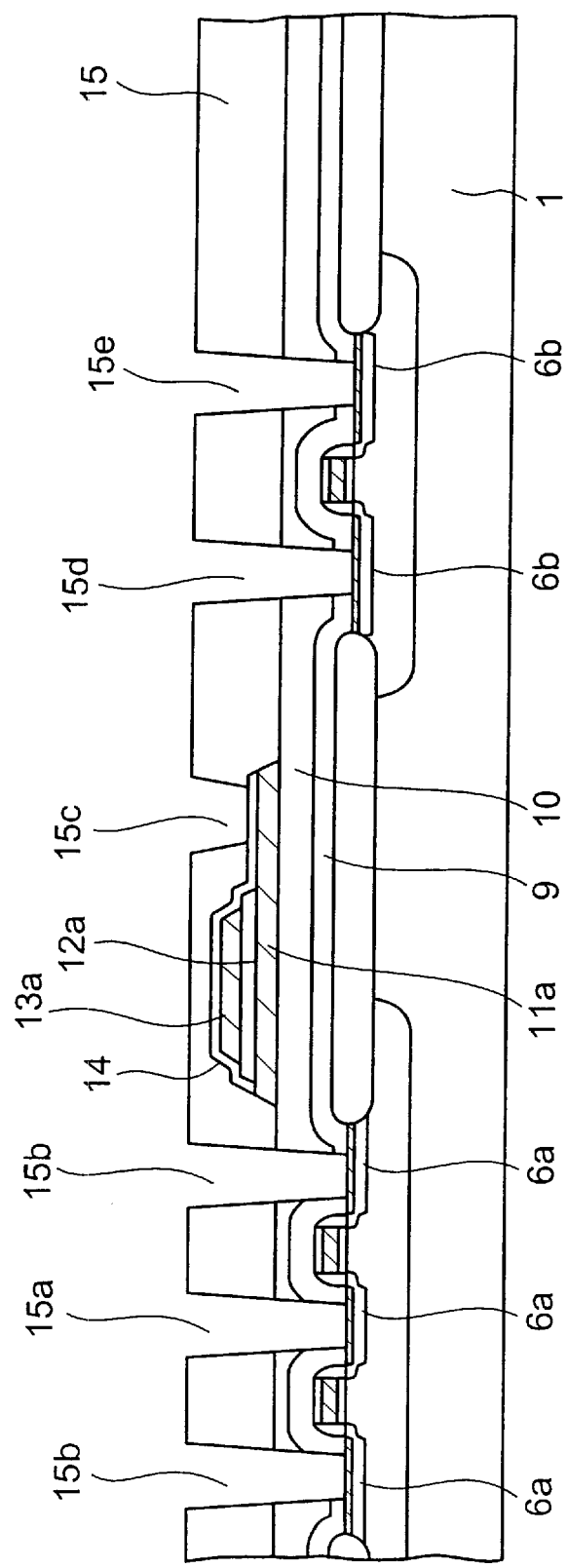
FIG. 24 is a sectional view showing the state that an encapsulation layer used in the FeRAM as the semiconductor device according to the embodiment of the present invention is left on a lower electrode of a capacitor.
Figure 25:
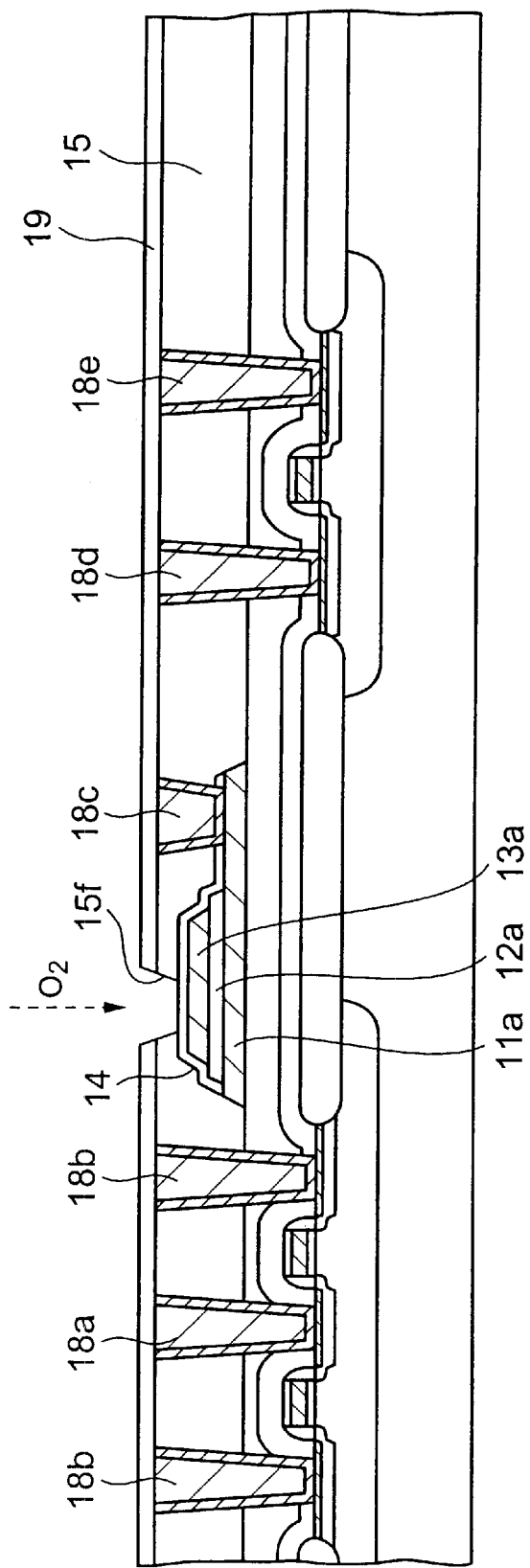
FIG. 25 is a sectional view showing the state that the encapsulation layer used in the FeRAM as the semiconductor device according to the embodiment of the present invention is left on the capacitor.

The encapsulation layer 14 shown in FIG. 4 is etched successively in forming the contact holes 15a to 15e in the second interlayer insulating film 15. But, as shown in FIG. 24, the encapsulation layer 14 may be left without the etching and then removed by the RF etching before the adhesion layer 17 shown in FIG. 8 is formed. Also, as shown in FIG. 11, the encapsulation layer 14 is etched successively when the contact hole 15f is formed on the upper electrode 13a of the capacitor Q. But, as shown in FIG. 25, the encapsulation layer 14 may be left and then removed by the RF etching in the former step to form the conductive film constituting the wiring 20b, etc. shown in FIG. 13. According to them, no damage is applied to the ferroelectric capacitor Q when the contact holes 15a to 15e are opened or the oxidation preventing film 19 is etched.

Figure 26:
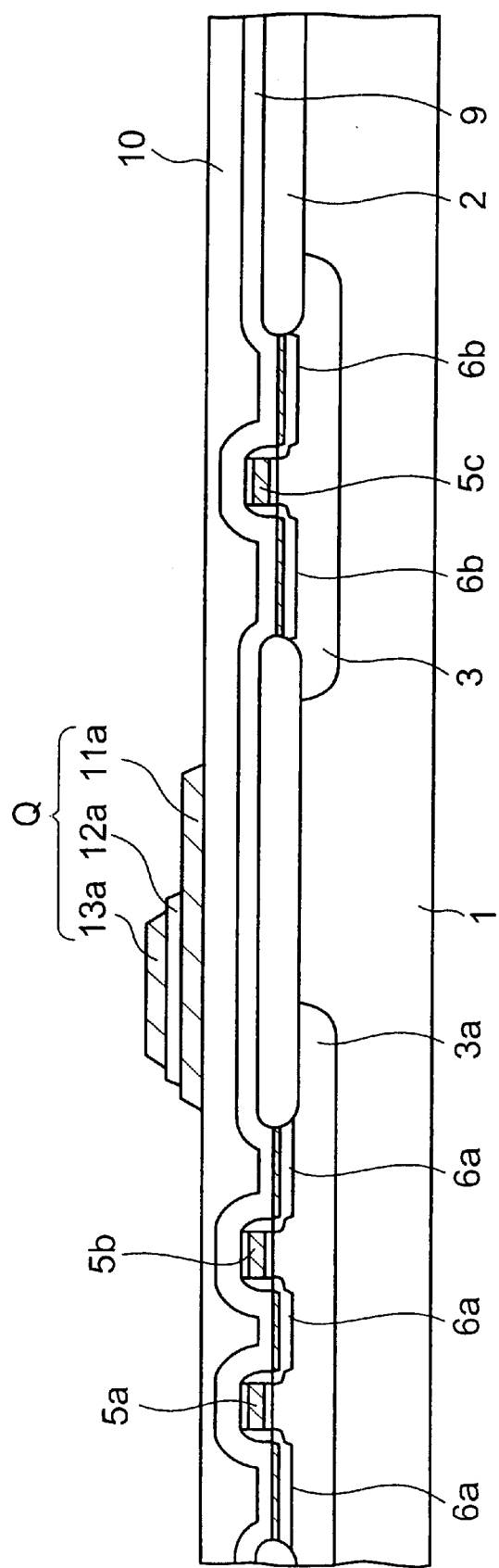
FIG. 26 is a sectional view showing the state that the encapsulation layer used in the FeRAM as the semiconductor device according to the embodiment of the present invention is not formed before the lower electrode of the capacitor is patterned.
Figure 27:
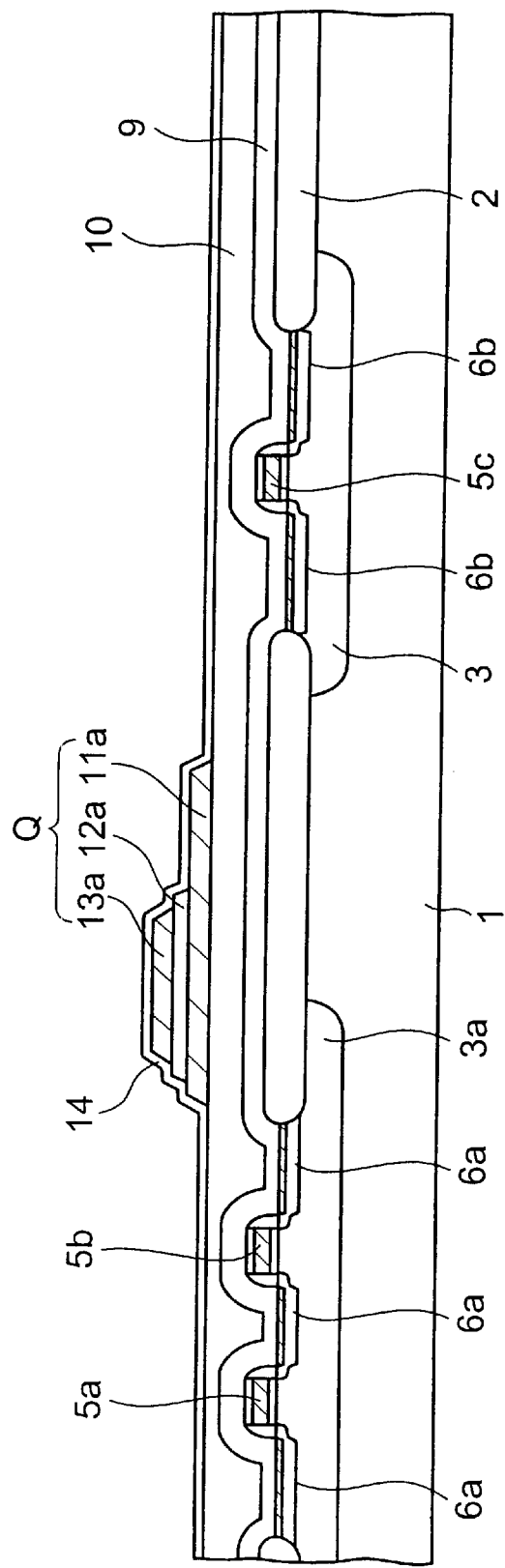
FIG. 27 is a sectional view showing the state that the encapsulation layer used in the FeRAM as the semiconductor device according to the embodiment of the present invention is formed after the lower electrode of the capacitor is patterned.

Moreover, the encapsulation layer 14 is not formed before the lower electrode 11a of the capacitor Q is patterned, but the overall capacitor Q and the second interlayer insulating film 10 may be covered with the encapsulation layer 14, as shown in FIG. 27, after the lower electrode 11a is patterned, as shown in FIG. 26.

The above plugs are formed of tungsten. However, the plugs may be formed of a single-layered film containing at least one of titanium, aluminum, copper, chromium, zinc, cobalt, tantalum, iron, nickel, magnesium, molybdenum, and lithium or a their laminated film.

As described above, the contact holes on the upper electrode of the capacitor and the contact holes on the lower electrode are not simultaneously opened, but the hole on the lower electrode is formed simultaneously with the holes on the impurity diffusion layers and then plugs are buried in the holes and then the hole is solely formed on the upper electrode of the capacitor. Therefore, the degradation of the dielectric film caused when the hole is formed on the upper electrode can be suppressed and the capacitor characteristics can be held satisfactorily.

In addition, since all holes can be formed in the second insulating film covering the capacitor by two steps, the increase in steps can be prevented.

Furthermore, since the first layer wiring formed on the second insulating film is directly connected without filling the plugs in the holes on the upper electrode of the capacitor, the capacitor can be prevented from the reducing gas used in forming the plugs.

Besides, since the first layer wiring extended from the hole on the upper electrode is connected to extend to the plugs on the impurity regions of the transistor, the complication of the structure can be prevented.

What is claimed is:

1. A semiconductor device comprising:
    a transistor having a first impurity region and a second impurity region formed in a semiconductor substrate and a gate electrode formed above the semiconductor substrate;
    a first insulating film for covering the transistor;
    a capacitor having a dielectric film formed on the first insulating film and made of one of ferroelectric material and high-dielectric material and an upper electrode and a lower electrode formed to put the dielectric film therebetween;
    a second insulating film formed above the capacitor and the first insulating film, and a surface of which is planarized;
    a first hole and a second hole formed in the first insulating film and the second insulating film on the first impurity region and the lower electrode, respectively;
    a first conductive plug and a second conductive plug formed of same material in the first hole and the second hole, respectively;
    a third hole formed in the second insulating film above the upper electrode of the capacitor;
    a first conductive pattern consisting of a conductive film formed on the second insulating film and connected to the upper electrode via the third hole and connected to the first conductive plug; and
    a second conductive pattern consisting of the conductive film and connected to an upper surface of the second conductive plug,
    wherein the first conductive plug and the second conductive plug are projected upwardly from a surface of the second insulating film.

2. A semiconductor device according to claim 1, further comprising:
    a fourth hole formed in the first insulating film and the second insulating film on the second impurity region of the transistor;
    a third conductive plug formed of a same material as the first conductive plug and the second conductive plug in the fourth hole; and
    a third conductive pattern consisting of the conductive film on the second insulating film and connected to an upper surface of the third conductive plug.

3. A semiconductor device according to claim 2, further comprising:
    a third insulating film formed on the first conductive pattern, the second conductive pattern, and the second insulating film to have a cavity therein, and a surface of which is planarized;
    a fourth insulating film formed on the surface of the third insulating film;
    a fourth conductive plug formed in the fourth insulating film and connected to the third conductive pattern; and
    a wiring formed on the fourth insulating film and connected to the fourth conductive plug.

4. A semiconductor device according to claim 1 or claim 2, wherein the conductive film on the second insulating film is formed of an aluminum film or an aluminum alloy film.

* * * * *